(12) United States Patent
DeReus

(10) Patent No.: US 6,876,482 B2
(45) Date of Patent: Apr. 5, 2005

(54) MEMS DEVICE HAVING CONTACT AND STANDOFF BUMPS AND RELATED METHODS

(75) Inventor: Dana Richard DeReus, Colorado Springs, CO (US)

(73) Assignees: Turnstone Systems, Inc., Livermore, CA (US); Wispry, Inc., Cary, NC (US)

( * ) Notice: Subject to any disclaimer, the term of this patent is extended or adjusted under 35 U.S.C. 154(b) by 0 days.

(21) Appl. No.: 10/291,107

(22) Filed: Nov. 8, 2002

(65) Prior Publication Data

US 2003/0116417 A1 Jun. 26, 2003

Related U.S. Application Data

(60) Provisional application No. 60/337,527, filed on Nov. 9, 2001, provisional application No. 60/337,528, filed on Nov. 9, 2001, provisional application No. 60/337,529, filed on Nov. 9, 2001, provisional application No. 60/338,055, filed on Nov. 9, 2001, provisional application No. 60/338,069, filed on Nov. 9, 2001, and provisional application No. 60/338,072, filed on Nov. 9, 2001.

(51) Int. Cl.[7] ............... G02B 26/00; H01S 57/00; H02N 10/00; G01J 1/36; H01B 13/00
(52) U.S. Cl. ............... 359/290; 359/291; 359/214; 200/181; 310/307; 310/309; 250/227.22; 250/214.1; 216/13; 333/262; 333/101; 356/519
(58) Field of Search ............... 359/290, 291, 359/295, 298, 247, 214, 221, 847, 848, 230, 224; 200/181; 250/214.1, 214 LS, 227.22; 310/306, 307, 309; 216/13, 83; 257/415, 417, 747; 356/519; 333/101, 105, 262; 438/52; 338/200; 337/36, 85; 427/162, 534

(56) References Cited

U.S. PATENT DOCUMENTS

| | | | | |
|---|---|---|---|---|
| 5,629,794 A | * | 5/1997 | Magel et al. | 359/290 |
| 5,920,391 A | * | 7/1999 | Grasdepot et al. | 359/291 |
| 6,331,257 B1 | * | 12/2001 | Loo et al. | 216/13 |
| 6,483,056 B2 | * | 11/2002 | Hyman et al. | 200/181 |
| 6,504,118 B2 | * | 1/2003 | Hyman et al. | 200/181 |
| 6,522,452 B2 | * | 2/2003 | Wood | 359/290 |
| 6,538,798 B2 | * | 3/2003 | Miller et al. | 359/291 |
| 6,566,617 B1 | * | 5/2003 | Suzuki et al. | 200/181 |
| 6,639,205 B2 | * | 10/2003 | Hsu et al. | 250/227.22 |

* cited by examiner

*Primary Examiner*—Loha Ben
(74) *Attorney, Agent, or Firm*—Pillsbury Winthrop LLP

(57) ABSTRACT

MEMS Device Having Contact and Standoff Bumps and Related Methods. According to one embodiment, a movable MEMS component suspended over a substrate is provided. The component can include a structural layer having a movable electrode separated from a substrate by a gap. The component can also include at least one standoff bump attached to the structural layer and extending into the gap for preventing contact of the movable electrode with conductive material when the component moves.

55 Claims, 14 Drawing Sheets

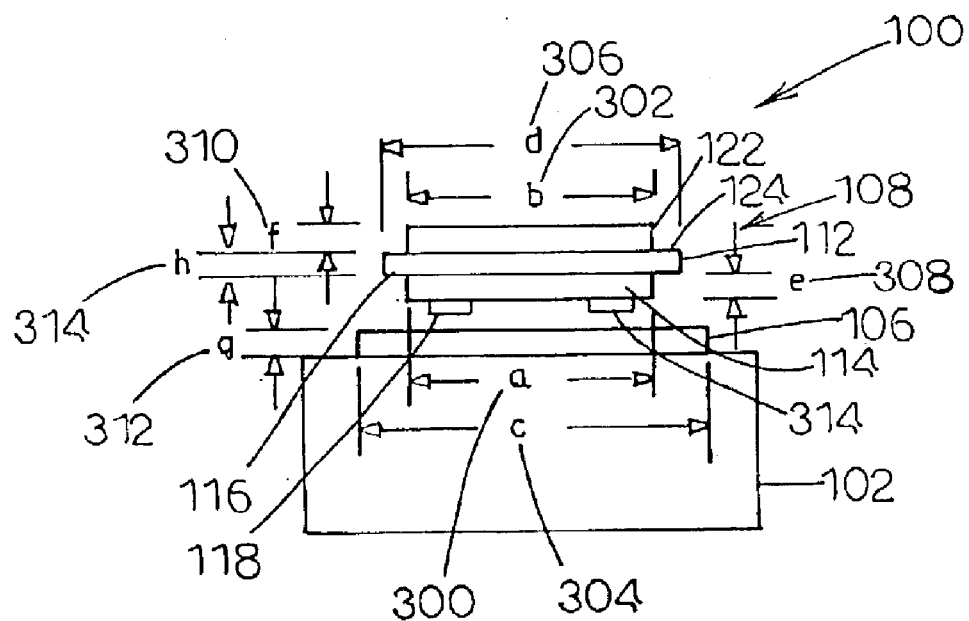
Fig·3
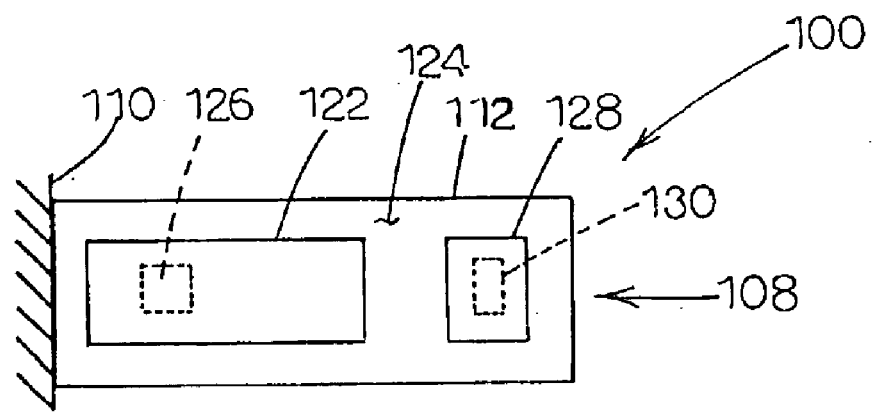
Fig·4

_US 6,876,482 B2_

MEMS DEVICE HAVING CONTACT AND STANDOFF BUMPS AND RELATED METHODS

CROSS-REFERENCE TO RELATED APPLICATIONS

This nonprovisional application claims the benefit of U.S. Provisional Application No. 60/337,527, filed Nov. 9, 2001; U.S. Provisional Application No. 60/337,528, filed Nov. 9, 2001; U.S. Provisional Application No. 60/337,529, filed Nov. 9, 2001; U.S. Provisionl Application No. 60/338,055, filed Nov. 9, 2001; U.S. Provisional Application No. 60/338,069, filed Nov. 9, 2001; U.S. Provisional Application No. 60/338,072, filed Nov. 9, 2001, the disclosures of which are incorporated by reference herein in their entirety. Additionally, the disclosures of the following U.S. patent applications, commonly assigned and simultaneously filed herewith, are all incorporated by reference herein in their entirety: U.S. patent application Ser. No. 10/290,779 filed Nov. 8, 2002; U.S. patent application Ser. No. 10/290,920 filed Nov. 8, 2002, now U.S. Pat. No. 6,746,891; U.S. patent application Ser. No. 10/291,125 filed Nov. 8, 2002, now U.S. Publication No. 2004/0012298; and U.S. patent application Ser. No. 10/290,807 filed Nov. 8, 2002, now U.S. Publication No. 2002/0117257.

TECHNICAL FIELD

The present invention generally relates to micro-electromechanical systems (MEMS) devices and methods. More particularly, the present invention relates to the design and fabrication of a MEMS device having contact and standoff bumps and related methods.

BACKGROUND ART

An electrostatic MEMS switch is a switch operated by an electrostatic charge and manufactured using micro-electromechanical systems (MEMS) techniques. A MEMS switch can control electrical, mechanical, or optical signal flow. MEMS switches have typical application to telecommunications, such as DSL switch matrices and cell phones, Automated Testing Equipment (ATE), and other systems that require low cost switches or low-cost, high-density arrays.

As can be appreciated by persons skilled in the art, many types of MEMS switches and related devices can be fabricated by either bulk or surface micromachining techniques. Bulk micromachining generally involves sculpting one or more sides of a substrate to form desired three-dimensional structures and devices in the same substrate material. The substrate is composed of a material that is readily available in bulk form, and thus ordinarily is silicon or glass. Wet and/or dry etching techniques are employed in association with etch masks and etch stops to form the microstructures. Etching is typically performed through the backside of the substrate. The etching technique can generally be either isotropic or anisotropic in nature. Isotropic etching is insensitive to the crystal orientation of the planes of the material being etched (e.g., the etching of silicon by using a nitric acid as the etchant). Anisotropic etchants, such as potassium hydroxide (KOH), tetramethyl ammonium hydroxide (TMAH), and ethylenediamine pyrochatechol (EDP), selectively attack different crystallographic orientations at different rates, and thus can be used to define relatively accurate sidewalls in the etch pits being created. Etch masks and etch stops are used to prevent predetermined regions of the substrate from being etched.

On the other hand, surface micromachining generally involves forming three-dimensional structures by depositing a number of different thin films on the top of a silicon wafer, but without sculpting the wafer itself. The films usually serve as either structural or sacrificial layers. Structural layers are frequently composed of polysilicon, silicon nitride, silicon dioxide, silicon carbide, or aluminum. Sacrificial layers are frequently composed of polysilicon, photoresist material, polyimide, metals, or various kinds of oxides, such as PSG (phosphosilicate glass) and LTO (low-temperature oxide). Successive deposition, etching, and patterning procedures are carried out to arrive at the desired microstructure. In a typical surface micromachining process, a silicon substrate is coated with an isolation layer, and a sacrificial layer is deposited on the coated substrate. Windows are opened in the sacrificial layer, and a structural layer is then deposited and etched. The sacrificial layer is then selectively etched to form a free-standing, movable microstructure such as a beam or a cantilever out of the structural layer. The microstructure is ordinarily anchored to the silicon substrate, and can be designed to be movable in response to an input from an appropriate actuating mechanism.

Many current MEMS switch designs employ a cantilevered beam/plate, or multiple-supported beam/plate geometry. In the case of cantilevered beams, these MEMS switches include a movable, bimaterial beam comprising a structural layer of dielectric material and a layer of metal. Typically, the dielectric material is fixed at one end with respect to the substrate and provides structural support for the beam. The layer of metal is attached on the underside of the dielectric material and forms a movable electrode and a movable contact. The layer of metal can be part of the anchor. The movable beam is actuated in a direction toward the substrate by the application of a voltage difference across the electrode and another electrode attached to the surface of the substrate. The application of the voltage difference to the two electrodes creates an electrostatic field, which pulls the beam towards the substrate. The beam and substrate each have a contact which is separated by an air gap when no voltage is applied, wherein the switch is in the "open" position. When the voltage difference is applied, the beam is pulled to the substrate and the contacts make an electrical connection, wherein the switch is in the "closed" position.

One of the problems that faces current MEMS switches is unwanted contact of the electrode pair. The electrodes of a MEMS switch are ideally positioned very close together while in an "open" position. By placing the electrodes closely together, the power required to deflect the beam to the "closed" position is reduced. However, an unwanted contact of the electrodes can result from this design. The electrodes can also touch if the beam deforms in such a way that the electrodes touch when the beam is moved to the "closed" position. Other undesirable structural deflections usually result from intrinsic or extrinsic stresses in the structural materials. Structural deflections due to intrinsic material stresses occur as a result of a nominal material stress value in combination with the structure design and/or an unbalanced composite structure, or a result of a stress gradient through the thickness of the structural material. The state of nominal and gradient residual stresses is a function of many varied processing conditions and parameters. A common undesirable structural deflection due to extrinsic stress occurs over temperature in composite structures comprised of two or more materials with different Coefficients of Thermal Expansion (CTE). It is undesirable for the electrodes to touch because an electrical short between the electrodes can result.

Some current MEMS switch designs having the bimaterial beam attempt to solve electrode shorting due to beam deformation problems by attaching the metal layer to the topside of the dielectric material. This design serves to prevent electrode shorting during beam deformation; however, this design requires a higher voltage for actuation because the gap distance between the metal layer and the electrode attached to the surface of the substrate is greater. Thus, such a design requires greater power consumption and possibly additional electrical components to achieve higher actuation voltages.

Therefore, it is desirable to provide a beam for improving the yield, performance over temperature, actuation, and quality of MEMS switches. It is also desirable to reduce the likelihood of electrodes touching each other during operation of the switch. It is also desirable to reduce the deformation of the beam in order to improve switch reliability. Furthermore, it is desirable to reduce switch power consumption.

DISCLOSURE OF THE INVENTION

According to one embodiment, a movable MEMS component suspended over a substrate is provided. The component can include a structural layer having a movable electrode separated from a substrate by a gap. The component can also include at least one standoff bump attached to the structural layer and extending into the gap for preventing contact of the movable electrode with conductive material when the component moves.

According to a second embodiment, a MEMS device having standoff bumps is provided and can include a substrate having a stationary electrode and a first stationary contact. The device can also include a movable component suspended above the substrate. The movable component can include a structural layer having a movable electrode and a movable contact, wherein the movable electrode is spaced from the stationary electrode by a first gap and the movable contact is spaced from the first stationary contact by a second gap. The movable component can also include at least one standoff bump attached to the structural layer and extending into the first gap for preventing the contact of the movable electrode with the stationary electrode.

According to a third embodiment, a MEMS switch having standoff bumps is provided and can include a substrate including a first and second stationary electrode and a stationary contact, wherein the stationary contact is positioned between the first and second stationary electrodes. The switch can also include a structural layer including a first and second end fixed with respect to the substrate and including first, second, and third portions having bottom surfaces, the bottom surfaces suspended over the substrate. The device can further include a first movable electrode attached to the bottom surface of the first portion and spaced from the first stationary electrode by a first gap and a first standoff bump attached to the structural layer and extending into the first gap for preventing the contact of the first movable electrode with the first stationary electrode. The switch can include a second movable electrode attached to the bottom surface of the second portion and spaced from the second stationary electrode by a second gap. Further, the switch can include a second standoff bump attached to the structural layer and extending into the second gap for preventing the contact of the second movable electrode with the second stationary electrode. The switch can also include a movable contact attached to the bottom surface of the third portion and suspended over the stationary contact.

According to a fourth embodiment, a MEMS switch having standoff bumps is provided and can include a substrate having a stationary electrode and a stationary contact. The switch can include a movable, folded component suspended above the substrate. The component can include a structural layer having a bottom surface and including a first and second folded beam and a cantilever attached to attachment ends of the first and second folded beams. The component can also include a movable electrode separated from the substrate by a first gap. The component can also include the following: at least one standoff bump attached to the structural layer and extending into the first gap for preventing contact of the movable electrode with conductive material when the component moves toward the substrate; a movable contact spaced from the stationary contact by a second gap; and at least one standoff bump attached to the structural layer and extending into the first gap for preventing the contact of the movable electrode with the stationary electrode.

According to a fifth embodiment, a method of implementing an actuation function in a MEMS device having standoff bumps is provided. The method can include providing a MEMS device having standoff bumps. The device can include the following: a substrate having a stationary electrode; a structural layer having a movable electrode spaced from the stationary electrode by a gap; and at least one standoff bump attached to the structural layer and extending into the first gap for preventing the contact of the movable electrode with the stationary electrode when the structural layer moves towards the stationary electrode. The method can also include applying a voltage between the movable electrode and the stationary electrode to electrostatically couple the movable electrode with the stationary electrode across the gap, whereby the structural layer is moved toward the substrate and the at least one standoff bump contacts the stationary electrode.

According to a sixth embodiment, a method for fabricating a movable, MEMS component having a standoff bump is provided. The method can include depositing a sacrificial layer on a conductive component and forming a movable electrode on the sacrificial layer for spacing the movable electrode and the conductive material by a gap upon the removal of the sacrificial layer. The method can also include forming a standoff bump in the sacrificial layer whereby the standoff bump extends into the gap between the movable electrode and the conductive component. Further, the method can include depositing a structural layer on the movable electrode and the standoff bump and removing the sacrificial layer to form a gap spacing the conductive component from the movable electrode whereby the standoff bump extends into the gap for preventing contact of the movable electrode with the conductive material when the component moves.

According to a seventh embodiment, a method for fabricating a MEMS device having a standoff bump is provided and can include forming a stationary electrode on a substrate. The method can include depositing a sacrificial layer on the stationary electrode and the substrate. The method can also include forming a movable electrode on the sacrificial layer for spacing the movable electrode and the stationary electrode by a gap upon the removal of the sacrificial layer. The method can also include forming a standoff bump in the sacrificial layer whereby the standoff bump extends into the gap between the movable electrode and the stationary electrode formed by the removal of the sacrificial layer. Further, the method can include depositing a structural layer on the movable electrode and the standoff bump. The method can include removing the sacrificial layer to form a gap spacing the stationary electrode and the movable electrode whereby the standoff bump extends into the gap for preventing contact of the movable electrode with the conductive material when the structural layer moves towards the stationary electrode.

Accordingly, it is an object to provide a MEMS device having contact and standoff bumps and related methods.

Some of the objects of the invention having been stated hereinabove, other objects will become evident as the description proceeds when taken in connection with the accompanying drawings as best described hereinbelow.

BRIEF DESCRIPTION OF THE DRAWINGS

Exemplary embodiments of the invention will now be explained with reference to the accompanying drawings, of which:

FIG. 3 illustrates a cross-sectional front view of a MEMS switch having standoff bumps;

FIG. 4 illustrates a top plan view of a MEMS switch having standoff bumps;

DETAILED DESCRIPTION OF THE INVENTION

Figure 1:
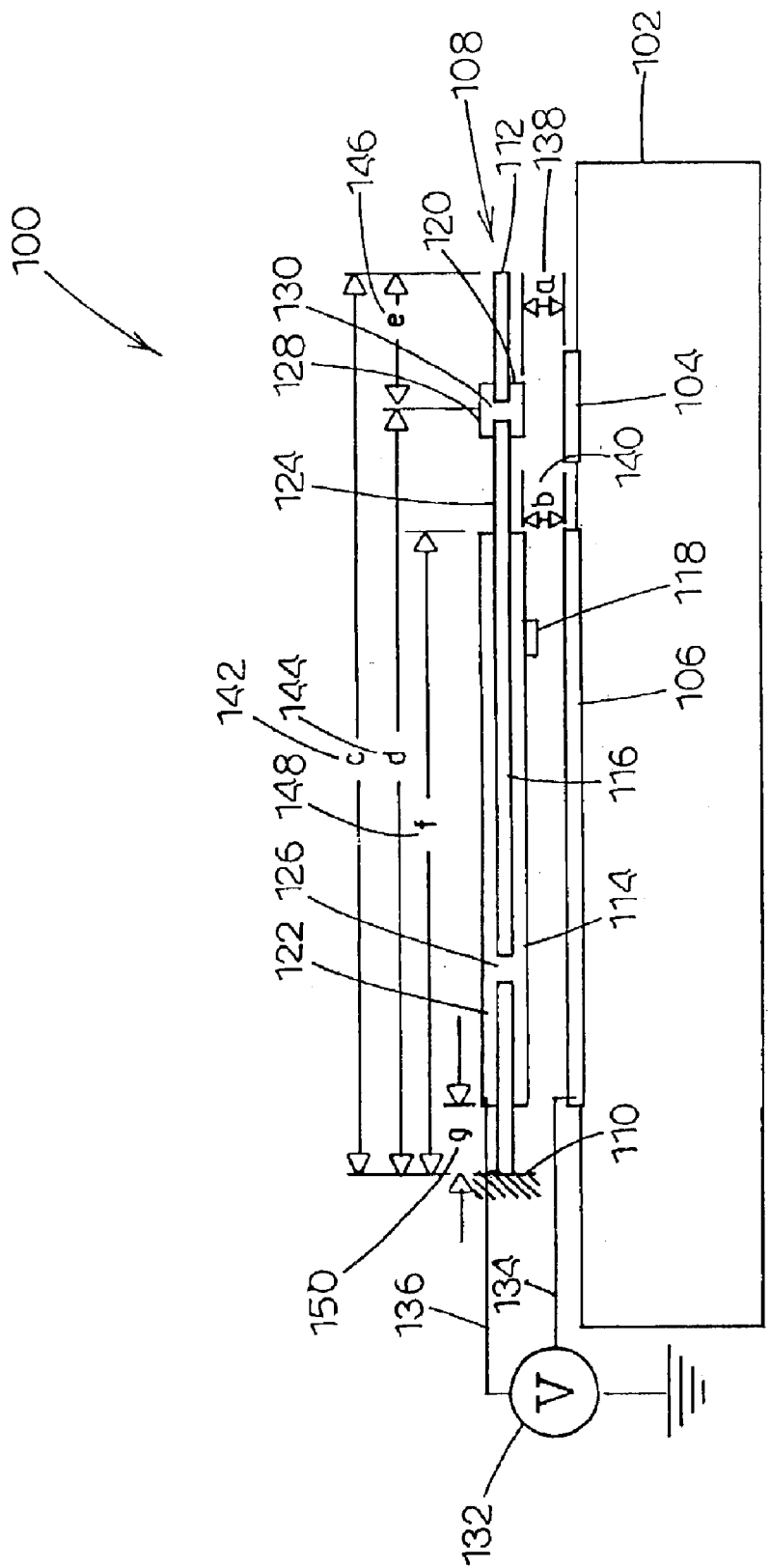
FIG. 1 illustrates a cross-sectional side view of a MEMS switch having standoff bumps in an "open" position in accordance with an embodiment of the present invention.

For purposes of the description herein, it is understood that when a component such as a layer or substrate is referred to herein as being deposited or formed "on" another component, that component can be directly on the other component or, alternatively, intervening components (for example, one or more buffer or transition layers, interlayers, electrodes or contacts) can also be present. Furthermore, it is understood that the terms "disposed on" and "formed on" are used interchangeably to describe how a given component can be positioned or situated in relation to another component. Therefore, it will be understood that the terms "disposed on" and "formed on" do not introduce any limitations relating to particular methods of material transport, deposition, or fabrication.

Contacts, interconnects, conductive vias, and electrodes of various metals can be formed by sputtering, CVD, or evaporation. If gold, nickel or PERMALLOY™ ($Ni_xFe_y$) is employed as the metal element, an electroplating process can be carried out to transport the material to a desired surface. The chemical solutions used in the electroplating of various metals are generally known. Some metals, such as gold, might require an appropriate intermediate adhesion layer to prevent peeling. Examples of adhesion material often used include chromium, titanium, or an alloy such as titanium-tungsten (TiW). Some metals combinations can require a diffusion barrier to prevent a chromium adhesion layer from diffusing through gold. Examples of diffusion barriers between gold and chromium include platinum or nickel.

Conventional lithographic techniques can be employed in accordance with fabrication, such as micromachining, of the invention described herein. Accordingly, basic lithographic process steps such as photoresist application, optical exposure, and the use of developers are not described in detail herein.

Similarly, generally known etching processes can be suitably employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed. As examples, poly-etch ($HF:HNO_3:CH_3COOH$) can generally be used for isotropic wet etching. Hydroxides of alkali metals (e.g., KOH), simple ammonium hydroxide ($NH_4OH$), quaternary (tetramethyl) ammonium hydroxide (($CH_3$)$_4$NOH, also known commercially as TMAH), and ethylenediamine mixed with pyrochatechol in water (EDP) can be used for anisotropic wet etching to fabricate V-shaped or tapered grooves, trenches or cavities. Silicon nitride can typically be used as the masking material against etching by KOH, and thus can used in conjunction with the selective etching of silicon. Silicon dioxide is slowly etched by KOH, and thus can be used as a masking layer if the etch time is short.

While KOH will etch undoped silicon, heavily doped (p++) silicon can be used as an etch-stop against KOH as well as the other alkaline etchants and EDP. Silicon oxide and silicon nitride can be used as masks against TMAH and EDP. The preferred metal used to form contacts and interconnects in accordance with the invention is gold and its alloys.

Commonly known wet etchants can be used to etch materials such as copper, gold, silicon dioxide, and secondary materials such as the adhesion and barrier materials. For example, gold can be etched with an aqueous solution of $KI_3$ in a temperature range of 20 to 50° C. As another example, chromium (a common adhesive layer) can be wet etched at 25° C. in a solution of ceric ammonium nitrate, nitric acid, and $H_2O$. Furthermore, for example, copper can be etched 25° C. in a dilute solution of nitric acid. A common method of etching silicon dioxide is with various aqueous solutions of HF or solutions of HF that are buffered with ammonium fluoride.

It will be appreciated that electrochemical etching in hydroxide solution can be performed instead of timed wet etching. For example, if a p-type silicon wafer is used as a substrate, an etch-stop can be created by epitaxially growing an n-type silicon end layer to form a p-n junction diode. A voltage can be applied between the n-type layer and an electrode disposed in the solution to reverse-bias the p-n junction. As a result, the bulk p-type silicon is etched through a mask down to the p-n junction, stopping at the n-type layer. Furthermore, photovoltaic and galvanic etch-stop techniques are also suitable.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to the methods of the invention as starting substrates for the fabrication of microstructures.

An alternate patterning process to etching is the lift-off process. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component." As used herein, the term "conductive" is generally taken to encompass both conducting and semiconducting materials.

Examples will now be described with reference to the accompanying drawings.

Referring to FIGS. 1–4, different views of a MEMS switch, generally designated 100, having a trilayered beam are illustrated. Referring specifically to FIG. 1, a side cross-sectional view of MEMS switch 100 is illustrated in an "open" position. MEMS switch 100 includes a substrate 102. Non-limiting examples of materials which substrate 102 can comprise include silicon (in single-crystal, polycrystalline, or amorphous forms), silicon oxinitride, glass, quartz, sapphire, zinc oxide, alumina, silica, or one of the various Group III–V compounds in either binary, ternary or quaternary forms (e.g., GaAs, InP, GaN, AlN, AlGaN, InGaAs, and so on). If the composition of substrate 102 is chosen to be a conductive or semi-conductive material, a non-conductive, dielectric layer can be deposited on the top surface of substrate 102, or at least on portions of the top surface where electrical contacts or conductive regions are desired.

Substrate 102 includes a first stationary contact 104, a second stationary contact (not shown), and a stationary electrode 106 formed on a surface thereof. First stationary contact 104, second stationary contact, and stationary electrode 106 comprises a conductive material such as a metal. Alternatively, first stationary contact 104, second stationary contact, and stationary electrode 106 can comprise a polysilicon or any suitable conductive material known to those skilled in the art. The conductivity of stationary electrode 106 can be much lower than the conductivity of first stationary contact 104 and second stationary contact. Preferably, first stationary contact 104 and second stationary contact comprises a very high conductivity material such as copper, aluminum, gold, or their alloys or composites. Alternatively, first stationary contact 104, second stationary contact, and stationary electrode 106 can comprise different conductive materials such as gold-nickel alloy ($AuNi_5$) and aluminum, respectively, and other suitable conductive materials known to those of skill in the art. The conductivity of stationary electrode 106 can be much lower than the conductivity of first stationary contact 104 and second stationary contact. Preferably, first stationary contact 104 and second stationary contact comprise a very high conductivity material such as copper. As an example, first stationary contact 104 and second stationary contact can have a width range 7 $\mu$m to 100 $\mu$m and a length range of 15 $\mu$m to 75 $\mu$m. Stationary electrode 106 can have a wide range of dimensions depending on the required actuation voltages, contact resistance, and other functional parameters. Preferably, the width range from 25 $\mu$m to 250 $\mu$m and the length ranges from 100 $\mu$m to 500 $\mu$m. However, the dimensions are only limited by manufacturability and the functional requirement.

MEMS switch 100 further comprises a movable, trilayered beam, generally designated 108, suspended over first stationary contact 104, second stationary contact, and stationary electrode 106. Beam 108 is fixedly attached at one end to a mount 110. Beam 108 extends substantially parallel to the top surface of substrate 102 when MEMS switch 100 is in an "open" position. Beam 108 generally comprises a structural dielectric layer 112 sandwiched between two electrically conductive layers. Structural layer 112 comprises a bendable material, preferably silicon oxide ($SiO_2$, as it is sputtered, electroplated, spun-on, or otherwise deposited), to deflect towards substrate 102 for operating in a "closed" position. Structural layer 112 provides electrical isolation and desirable mechanical properties including resiliency properties. Alternatively, structural layer 112 can comprise silicon nitride ($Si_xN_y$), silicon oxynitride, alumina or aluminum oxide ($Al_xO_y$), polymers, polyimide, high resistivity polysilicon, CVD diamond, their alloys, or any other suitable non-conductive, resilient material known to those of skill in the art.

Beam 108 further includes an electrically conductive movable electrode 114 attached to an underside surface 116 of structural layer 112. Movable electrode 114 forms a second layer of beam 108. Movable electrode 114 is positioned over stationary electrode 106 and displaced from stationary electrode 106 by an air gap when MEMS switch 100 is operating in the "open" position. Beam 108 is moved in a direction toward substrate 102 by the application of a voltage difference across stationary electrode 106 and movable electrode 114. The application of the voltage difference to stationary electrode 106 and movable electrode 114 creates an electrostatic field, which causes beam 108 to deflect towards substrate 102. The operation of MEMS switch 100 is described in further detail below. Movable electrode 114 is dimensioned substantially the same as stationary electrode 106. Movable electrode 114 can be dimensioned substantially the same as stationary electrode 106. Matching the dimensions of movable electrode 114 and stationary electrode 106 produces the maximum electrostatic coupling, thereby actuation force. This consideration ignores any contribution from fringing field effects at the edge of the respective electrodes. Matching the dimensions of movable electrode 114 and stationary electrode 106 has some disadvantages that can be overcome by mismatching their respective dimensions. By making stationary electrode 106 larger in extent than movable electrode 114, the manufacturing process tolerances and manufacturing alignment tolerances have a minimized effect on the actuation response. A second consideration is the intensification of the electric fields, in the space between movable electrode 114 and stationary electrode 106, which is increased by the closest proximity of the edges of these two electrodes. Because of dielectric or gas breakdown issues, it is desirable to move far apart the edges of these two electrodes. A third consideration is shielding, whereby stationary electrode 106 can shield movable electrode 114 from charge or other electric potentials on substrate 102. Movable electrode 114 and stationary electrode 106 can comprise similar materials, such as gold, such that the manufacturing process is simplified by the minimization of the number of different materials required for fabrication. Movable electrode 114 and stationary electrode 106 can comprise conductors (gold, platinum, aluminum, palladium, copper, tungsten, nickel, and other materials known to those of skill in the art), conductive oxides (indium tin oxide), and low resistivity semiconductors (silicon, polysilicon, and other materials known to those of skill in the art). Movable electrode 114 comprises a conductive material that includes adhesion layers (Cr, Ti, TiW, etc.) between movable electrode 114 and structural material 112. Movable electrode 114 comprises a conductive material and an adhesion layer that includes diffusion barriers for preventing diffusion of the adhesion layer through the electrode material, the conductor material through the adhesion layer or into the structural material.

Movable electrode 114 and stationary electrode 106 can comprise different materials for breakdown or arcing considerations, "stiction" considerations during wet chemical processing, or fabrication process compatibility issues.

Beam 108 further includes a first standoff bump 118 and a second standoff bump (shown in FIG. 3) attached to structural layer 112 and protruding through movable electrode 114 towards stationary electrode 106. First standoff bump 118 is positioned between movable electrode 114 and stationary electrode 106 for intercepting stationary electrode 106 prior to the surface of movable electrode 114 when MEMS switch 100 is moved to a "closed" position. First standoff bump 118 prevents movable electrode 114 from contacting stationary electrode 106. First standoff bump 118 preferably comprises a non-conductive material for preventing an unwanted electrical short between movable electrode 114 and stationary electrode 106. Preferably first standoff bump 118 and the second standoff bump are manufactured with the same non-conductive material as structural layer 112 since first standoff bump 118 and the second standoff bump can be formed when structural layer 112 is produced. Standoff bump 118 can comprise a non-conductive material such as alumina, aluminum oxide ($Al_xO_y$), silicon dioxide ($SiO_2$), silicon nitride ($Si_xN_y$), CVD diamond, polyimide, high resistivity polysilicon, or other suitable materials known to those of skill in the art. Standoff bump 118 can also comprise an electrically isolated material, such as gold or aluminum, or an electrically-isolated semiconductor material such as single crystal or polycrystalline silicon. Some examples of non-shorting combinations of standoff bump material and intercepting material include a nonconductive bump to conductive intercepting material, electrically-isolated conductive standoff bump to conductive intercepting material, conductive or nonconductive standoff bump to a non-conductive intercepting surface, and a conductive or non-conductive standoff bump to electrically isolated conductive surface. Preferably, first standoff bump 118 and the second standoff bump are positioned near the end of the movable electrode furthest from the anchor. Alternatively, first standoff bump 118 and the second standoff bump can be positioned near areas of movable electrode 114 that would contact stationary electrode 106 first during actuation.

Beam 108 further includes an electrically conductive, movable contact 120 attached to underside surface 116 of structural layer 112 and suspended over first stationary contact 104 and the second stationary contact. The movable contact 120 is positioned in this manner so that it will provide electrical connection between first stationary contact 104 and the second stationary contact when beam 108 is in the "closed" position. Movable contact 120 is positioned over first stationary contact 104 and the second stationary contact and displaced from the contacts by an air gap when MEMS switch 100 is operating in the "open" position. When MEMS switch 100 is moved to the "closed" position, movable contact 120 and first stationary contact 104 and the second stationary contact make an electrical connection. First standoff bump 118 and the second standoff bump can contact stationary electrode 106 simultaneously to prevent stationary electrode 106 from contacting movable electrode 118. Alternatively, first standoff bump 118 and the second standoff bump can contact stationary electrode 106 before or after movable contact 120 contacts stationary contact 104. Movable contact 120 is dimensioned smaller than first stationary contact 104 and second stationary contact to facilitate contact when process variability and alignment variability are taken into consideration. First stationary contact 104 and the second stationary contact is sized so that movable contact 120 always makes contact with first stationary contact 104 and the second stationary contact on actuation. A second consideration that determines the size of movable contact 120 and first stationary contact 104 and the second stationary contact is the parasitic response of the switch. The parasitic actuation response is generated by electric fields produced by potential differences between movable electrode 114 and stationary electrode 106, or by potential/charge differences between stationary electrode 106 and beam 108 that produce electric fields and a force on movable contact 120. The dimensions of movable contact 120 are connected to the dimensions of movable electrode 114 to achieve a specific ratio of the parasitic actuation to the actuation voltage.

In this embodiment, movable contact 120 is formed of the same conductive material as movable electrode 114 because they are each formed from the same layer. Movable contact 120 and movable electrode 114 can comprise conductors (e.g., gold, platinum, aluminum, palladium, copper, tungsten, nickel, and other suitable materials known to those of skill in the art), conductive oxides (e.g., indium tin oxide and other suitable materials known to those of skill in the art), and low resistivity semiconductors (silicon, polysilicon, and other suitable materials known to those of skill in the art). Movable contact 120 comprises a conductive material that includes adhesion layers (Cr, Ti, TiW, and other suitable materials known to those of skill in the art) between movable contact 120 and structural material 112. Movable contact 120 comprises a conductive material and adhesion layer that includes diffusion barriers for preventing diffusion of the adhesion layer through the electrode material, the conductor material through the adhesion layer or into the structural material. The fabrication process is simplified by having movable contact 120 and movable electrode 114 manufactured of the same material that is deposited and patterned during the same photolithography steps. This is not a necessary requirement for the operation of the switch because of the requirements for movable contact 120 and movable electrode 114 materials are different. The requirement of the material of movable electrode 114 is that it is a good conductor. The requirements for movable contact 120 include low resistivity, low hardness, low oxidation, low wear, and other desirable properties of suitable contacts known to those of skill in the art.

Beam 108 further includes an electrode interconnect 122 attached to a topside surface 124 of structural layer 112. Electrode interconnect 122 forms a third layer on beam 108. As shown, electrode interconnect 122 is attached on an opposite side of structural layer 112 from movable electrode 114. Electrode interconnect 122 is dimensioned substantially the same as movable electrode 114. In this embodiment, electrode interconnect 122 has the same dimensions as movable electrode 114 and is aligned with movable electrode 114. Alternatively, electrode interconnect 122 can have different dimensions and extent than movable electrode 114. Preferably, electrode interconnect 122 has the same dimensions as movable electrode 114 and is aligned with movable electrode 114 in order to achieve a manufacturable flatness that is maintained over temperature.

In this embodiment, electrode interconnect 122 comprises a conductive material having the same coefficient of thermal expansion, elastic modulus, residual film stress, and other electrical/mechanical properties as movable electrode 114. Electrode interconnect 122 and movable electrode 114 can comprise conductors (e.g., gold, platinum, aluminum, palladium, copper, tungsten, nickel, and other suitable materials known to those of skill in the art), conductive oxides (e.g., indium tin oxide and other suitable materials known to those of skill in the art), and low resistivity semiconductors (e.g., silicon, polysilicon, and other suitable materials known to those of skill in the art). Electrode interconnect 122 comprises a conductive material that includes adhesion layers between electrical interconnect 122 and the structural material 112. The electrical interconnect 122 comprises a conductive material and adhesion layer that includes diffusion barriers for preventing diffusions of the adhesion layer through the electrode material, the conductor material through the adhesion layer or into the structural material. In a second embodiment, interconnect 122 comprises a conductive material that is different from the conductive material comprising the movable electrode 114. Electrode interconnect 122 is electrically connected to movable electrode 114 by an interconnect via 126. Interconnect via 126 comprises a conductive material formed through structural layer 112 for electrically connecting movable electrode 114 and electrode interconnect 122. Interconnect via 126 comprises the same conductive material as electrode interconnect 122 and movable electrode 114. Alternatively, interconnect via 126 can comprise a different conductive material as electrode interconnect 122 movable electrode 114.

Beam 108 further includes a contact interconnect 128 attached to topside surface 124 of structural layer 112. As shown, contact interconnect 128 is attached on a side of structural layer 112 opposite from movable contact 120. Contact interconnect 128 is dimensioned substantially the same as movable contact 120. Contact interconnect 128 and movable contact 120 are aligned with respect to each other and have the same dimensions. Alternatively, contact interconnect 128 can have different dimensions and extent than movable contact 120. It is intended to maintain geometric equivalence by management of the mechanical form. Contact interconnect 128 and movable contact 120 are intended to share a geometrical and thermo-mechanical equivalence. This equivalence provides beam, which can achieve a manufacturable flatness that is maintained over temperature and other environmental conditions, such as die attachment, package lid seal processes, or solder reflow process.

Contact interconnect 128 comprises a conductive material having the same coefficient of thermal expansion, elastic modulus, residual film stress, and other desirable electrical/mechanical properties known to those of skill in the art as movable contact 120. Contact interconnect 128 and movable contact 120 can comprise conductors (e.g., gold, platinum, aluminum, palladium, copper, tungsten, nickel, and other suitable materials known to those of skill in the art), conductive oxides (e.g., indium tin oxide and other suitable materials known to those of skill in the art), and low resistivity semiconductors (silicon, polysilicon, and other suitable materials known to those of skill in the art). Contact interconnect 128 can comprise a conductive material that includes adhesion layer (e.g., Cr, Ti, TiW, and other suitable materials known to those of skill in the art) between contact interconnect 128 and structural material 112. Contact interconnect 128 can also comprises a conductive material and adhesion layer that includes diffusion barriers for preventing diffusion of the adhesion layer through the electrode material, the conductor material through the adhesion layer or into the structural material. Alternatively, electrode interconnect 126 can comprise a conductive material that is different than the conductive material comprising movable contact 120. This alternative embodiment requires that the interconnect contact be designed to have dimension such that it geometrically and thermomechanically balance the difference in material properties. Contact interconnect 128 is electrically connected to movable contact 120 by a second interconnect via 130. Second interconnect via 130 comprises a conductive material formed through structural layer 112 for electrically connecting movable contact 120 and contact interconnect 128. Interconnect via 130 comprises the same conductive material as contact interconnect 128 and movable contact 120. Interconnect via 130 can comprise a different conductive material as contact interconnect 128 and movable contact 120. For example, interconnect via 130 can comprise tungsten or aluminum, whereas contact interconnect 128 and movable contact 120 can comprise, for example, gold. In this embodiment, second interconnect via 130 comprises the same material as first interconnect via 124, interconnect electrode 120, and contact interconnect 128. Alternatively, second interconnect via 130 can comprise different materials than first interconnect via 126, interconnect electrode 122, or contact interconnect 128.

Figure 2:
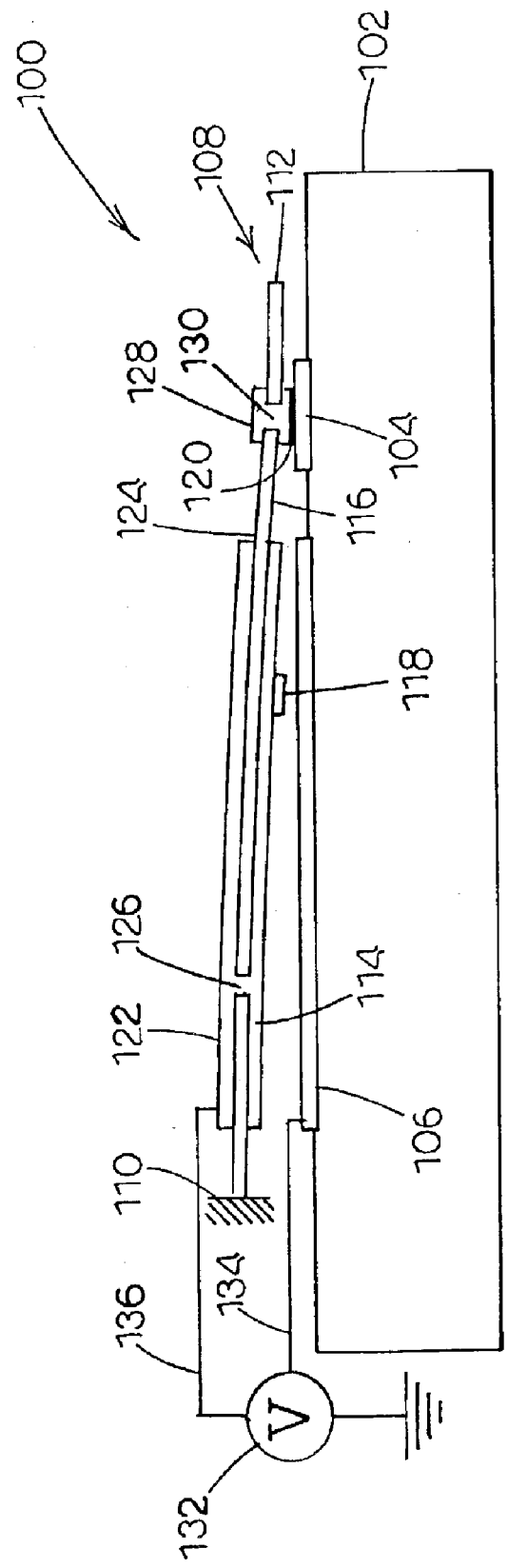
FIG. 2 illustrates a cross-sectional side view of a MEMS switch having standoff bumps in a "closed" position.

MEMS switch 100 is operated by applying a potential voltage difference between movable electrode 114 and stationary electrode 106. The applied potential voltage causes beam 108 to deflect towards substrate 102 until movable contact 120 touches first stationary contact 104 and the second stationary contact, thus establishing an electrical connection between movable contact 120 and first stationary contact 104 and the second stationary contact. Referring to FIG. 2, a cross-sectional side view of MEMS switch 100 is illustrated in a "closed" position. As shown in the "closed" position, movable contact 120 is touching first stationary contact 104 and the second stationary contact. Furthermore, first standoff bump 118 is contacting stationary electrode 106. As described below, the components of MEMS switch 100 are dimensioned such that movable electrode 114 does not contact stationary electrode 106 in the "closed" position, thus preventing a short between components 106 and 114. Furthermore, the components of MEMS switch 100 are dimensioned such that first stationary contact 104 and the second stationary contact touch movable contact 120 in the "closed" position. MEMS switch 100 is returned to an "open" position by sufficiently reducing or removing the voltage difference applied across stationary electrode 106 and movable electrode 114. This in turn reduces the attractive force between movable electrode 114 and stationary electrode 106 such that the resiliency of structural layer 112 enables structural layer 124 to return to a position substantially parallel to the surface of substrate 102.

Referring now to FIG. 1, a voltage source 132 provides the voltage difference between stationary electrode 106 and movable electrode 114. Stationary electrode 106 is directly connected to voltage source through a conductive line 134. Movable electrode 114 is electrically connected to voltage source 132 through interconnect via 126, electrode interconnect 122, and a second conductive line 136. Conductive line 136 provides a connection between voltage source 132 and electrode interconnect 122. Interconnect via 126 provides a connection between electrode interconnect 122 and movable electrode 114. Therefore, on the application of a voltage by voltage source 132, a voltage difference is created between stationary electrode 106 and movable electrode 114. This establishes electrostatic coupling between movable electrode 114 and stationary electrode 106 across the air gap. Alternatively, the gap between movable electrode 114 and stationary electrode 106 can be any suitable isolating fluid as known to those of skill in the art.

First stationary contact 104, the second stationary contact, stationary electrode 106, movable contact 110, movable electrode 112, electrode interconnect 114, contact interconnect 116, and interconnect vias 122 and 124 comprise a metal in this embodiment. Preferably, movable electrode 114 and electrode interconnect 122 are fabricated of the same material and dimensioned the same in order to perform two functions. First, it provides mechanical balance on both sides of structural layer 112. The mechanical balance is provided because of the elastic symmetry, because the films are deposited in the same way to produce a symmetric stress field, and because the thermal expansion properties are symmetric. The elastic symmetry is preserved by using the same material and by using the same dimensions. The symmetric stress field is produced by depositing the same materials using the same process and thicknesses. The symmetric thermal expansion properties minimize any variation in the switch operation with respect to temperature because the same material is on either side of structural layer 112. This means that any functional variation exhibited by MEMS switch 100 depends primarily on the process variation, which can be minimized by the appropriate optimization of the design in the process. Secondly, contact carrying capacity can be increased because movable contact 120 and contact interconnect 128 are fabricated of the same material, dimensioned the same, and electrically connected by interconnect via 130. It is preferable that beam 108 has the same type metal, deposited by the same process, patterned in the same geometry, and deposited to the same thickness, but the use of different materials could be accommodated with the appropriate design and characterization. To address the issues of contact adhesion, cold welding, or hot welding, first stationary contact 104, the second stationary contact, stationary electrode 106, movable electrode 114, movable contact 120, electrode interconnect 122, contact interconnect 126, and interconnect vias 126 and 130 could be different materials or different alloys of the same materials. The material selection minimizes contact resistance and failures such as stiction.

In the "open" position, movable contact 120 is separated from first stationary contact 104 and the second stationary contact by a gap distance a 138 as shown in FIG. 1. Movable electrode 114 is separated from stationary electrode 106 by a gap distance b 140. In this embodiment, distance a 138 is less distance b 140. If distance a 138 is less distance b 140, the operation of MEMS switch 100 is more reliable because potential for shorting between stationary electrode 106 and movable electrode 114 is reduced. The length of beam 108 is indicated by a distance c 142. The center of movable contact 120 is a distance d 144 from mount 110 and a distance e 146 from the end of beam 108 that is distal mount 110. The edge of electrode interconnect 122 distal mount 110 is a distance f 148 from mount 110. In this embodiment, distance a 138 is preferably nominally microns; distance b 140 is preferably 2 microns; distance c 142 is preferably 155 microns; distance d 144 is preferably 135 microns; distance e 146 is preferably 20 microns; distance f 148 is preferably 105 microns; and distance g 150 is preferably 10 microns. These dimensions are designated to provide certain functional performance, but other dimensions can be selected to optimize manufacturability and reliability for other functional requirements. For example, in this embodiment, standoff bump 118 is separated from stationary electrode 106 by distance a 138. Depending on requirements, the distance separating standoff bump 118 from stationary electrode 106 can be a different distance than or identical distance to the distance separating movable contact 120 from stationary contact 104.

Referring to FIG. 3, a cross-sectional front view of stationary electrode 106, structural layer 112, movable electrode 114, and electrode interconnect 120 of MEMS switch 100 is illustrated. The width of movable electrode 114 is indicated by a distance a 300. The width of electrode interconnect 120 is indicated by a distance b 302. Preferably, movable electrode 114 and electrode interconnect 120 are equal in width. Alternatively, movable electrode 114 and electrode interconnect 120 can have different widths. The width of stationary electrode 106 is indicated by distance c 304. The width of structural layer 112 is indicated by distance d 306. The thicknesses of movable electrode 114, electrode interconnect 120, and stationary electrode 106 are indicated by distances e 308, f 310, and g 312, respectively. The thickness of structural layer 118 is indicated by distance h 314. First stationary contact 104 and stationary electrode 106 can be dimensioned greater than movable electrode 114 and movable contact 120, respectively, in order to facilitate shielding MEMS switch 100 from any parasitic voltages. As described above, MEMS switch 100 includes a second standoff bump 314. In the alternative, it is envisioned that structural layer 112 or movable electrode 314 can include a single standoff bump extending across the width of structural layer 112 or movable electrode 314, respectively. In this embodiment, distance a 300 is 75 microns; distance b 302 is preferably 75 microns; distance c 304 is preferably 95 microns; distance d 306 is preferably 85 microns; distance e 308 is preferably 0.5 microns; distance f 310 is preferably 0.5 microns; distance g 312 is preferably between 0.3 and 0.5 microns; and distance h 314 is preferably 2 microns. These dimensions are selected to provide certain functional performance. Other dimensions can be selected to optimize manufacturability and reliability for other functional requirements.

Referring to FIG. 4, a top view of MEMS switch 100 is illustrated. As shown, electrode interconnect 120 and contact interconnect 128 are generally rectangular in shape. The external corners of electrode interconnect 120 and contact interconnect 128 can be rounded to contain internal reentrant corners for reducing the intensification in the electric fields produced by the potential differences between conductors. In this embodiment, movable electrode 114 is dimensioned the same as electrode interconnect 124. Alternatively, electrode interconnect 124 can be another shape which substantially matches the shape of movable electrode 114. Furthermore, the shape of contact interconnect 128 substantially matches the shape of movable contact 120. Interconnect vias 126 and 130 are shown by broken lines. In this embodiment, interconnect vias 126 and 130 are rectangular in shape, but can also be circular, elliptical, or rectangular with rounded corners. The width of electrode interconnect 120 is substantially equal to the width of contact interconnect 128. In this embodiment, the width of electrode interconnect 122 and contact interconnect 128 is 75 microns.

Figure 5:
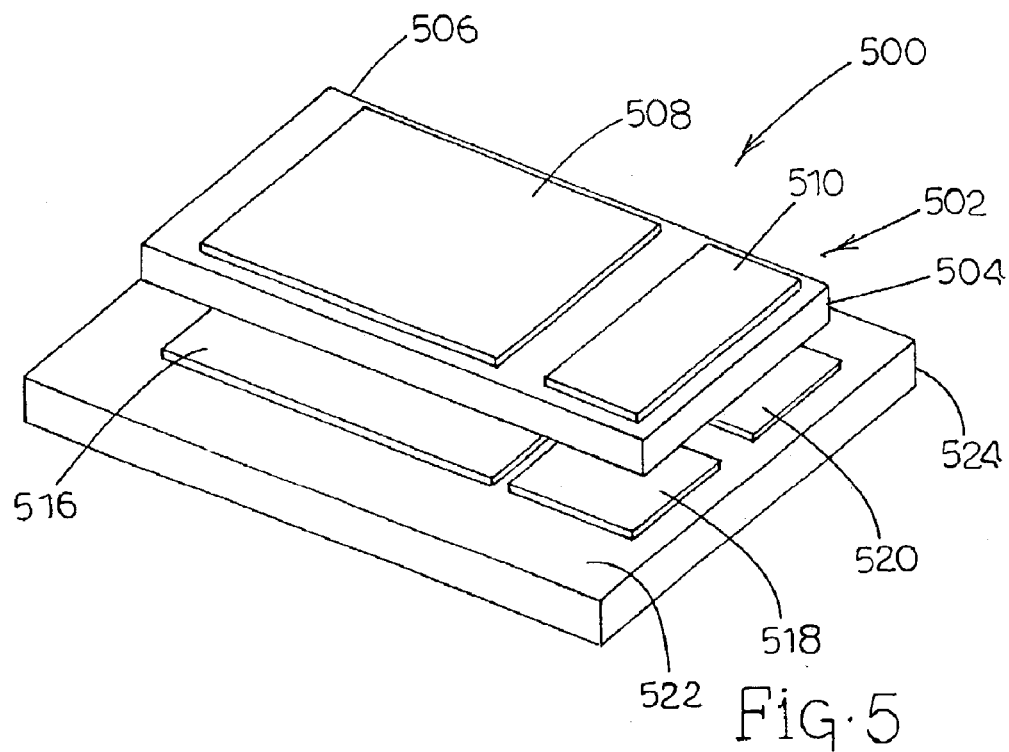
FIG. 5 illustrates a perspective top view of a MEMS switch having standoff and contact bumps in accordance with another embodiment of the present invention.
Figure 6:
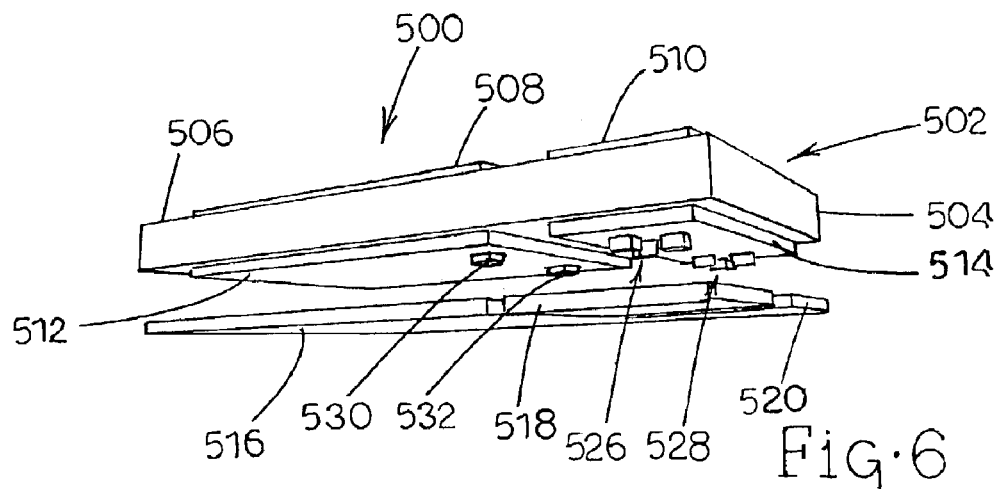
FIG. 6 illustrates a perspective bottom view of a MEMS switch having standoff and contact bumps.

Referring to FIGS. 5 and 6, different views of another MEMS switch, generally designated 500, in accordance with another embodiment of the present invention are illustrated. Referring specifically to FIG. 5, a perspective top view of MEMS switch 500 is illustrated. MEMS switch 500 includes a beam, generally designated 502, having a structural layer 504 attached at an end 506 to a mount (not shown). Beam 502 further includes an electrode interconnect 508 and a contact interconnect 510 attached to the top side of structural layer 504. A movable electrode 512 (shown in FIG. 6) and movable contact 514 (shown in FIG. 6) are positioned on the underside of structural layer 504 in alignment with and dimensioned substantially the same as electrode interconnect 508 and a contact interconnect 510, respectively. Electrode interconnect 508 and contact interconnect 510 are electrically connected to the movable electrode and the movable contact, respectively, through structural layer 504 by interconnect vias as described above.

Referring now to FIG. 6, a perspective bottom view of MEMS 500 switch is illustrated. MEMS switch 500 further includes a stationary electrode 516 and stationary contacts 518 and 520 attached to a surface 522 of a substrate 524 (shown in FIG. 5). Movable contact 514 touches contacts 518 and 520 when MEMS switch 500 is operating in a "closed" position. Thus, in a "closed" position, stationary contacts 518 and 520 are electrically connected via movable contact 514. Further, contacts 518 and 520 can be connected through movable contact 522 and contact interconnect 510. Movable contact 514 further includes a first and second set of contact bumps, generally designated 526 and 528, respectively. Contact bumps 526 and 528 comprise a conductive material for facilitating electrical communication between stationary contacts 518 and 520 in the "closed" position. Contact bumps 526 and 528 reduce the gap distance between movable contact 514 and stationary contacts 518 and 520, thus reducing the potential for shorting between stationary electrode 516 and movable electrode 512. Contact bumps 526 and 528 insure reliable contact with stationary contacts 518 and 520 because without contact bumps there is a potential for interference between movable contact 514 and surface 522 between stationary contact 518 and 520. Additionally, contact bumps 526 and 528 provide design flexibility to meet contact resistance and current capacity requirements. These requirements can be achieved by optimization of the following: contact bump geometry (e.g., circular, square, elliptical, rectangular hemispherical) and the geometric pattern of the contact bumps, such as a rectangular pattern (as shown with 1 bump leading 2 bumps), a triangular pattern (with 2 bumps leading 1 bump), an elliptical pattern, and a star pattern. In this embodiment, contact bumps 526 and 528 are shown cylindrical and in a triangular grouping of 3 bumps, wherein 1 bump leads 2 bumps. Furthermore, contact bumps 526 and 528 can be considered a macro definition of contact asperities, which are normally determined by the surface roughness of the contacting surfaces. The contact resistance and current capacity are determined by the number of microscopic asperities, so the macroscopic definition of asperities enhances the design space.

MEMS switch 500 further includes a first standoff bump 530 and a second standoff bump 532 attached to structural layer 504 and protruding through movable electrode 512 towards stationary electrode 516. Standoff bumps 530 and 532 are positioned between movable electrodes 512 and stationary electrode 516 for intercepting stationary electrode 516 prior to the surface of moveable electrode 512 when MEMS switch 510 is moved to a "closed" position.

Figure 7:
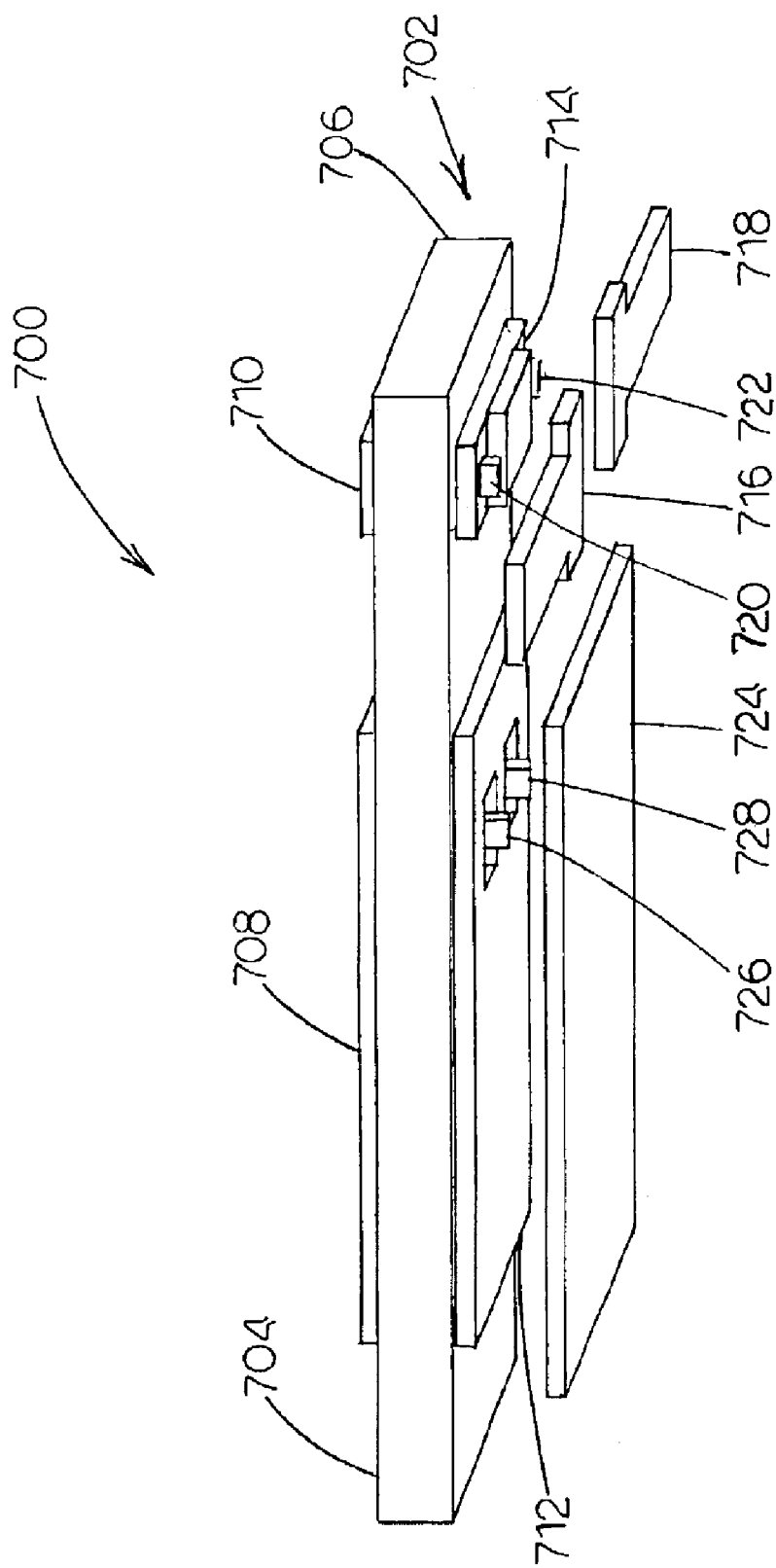
FIG. 7 illustrates a perspective bottom view of another embodiment of a MEMS switch having standoff and contact bumps.
Figure 8:
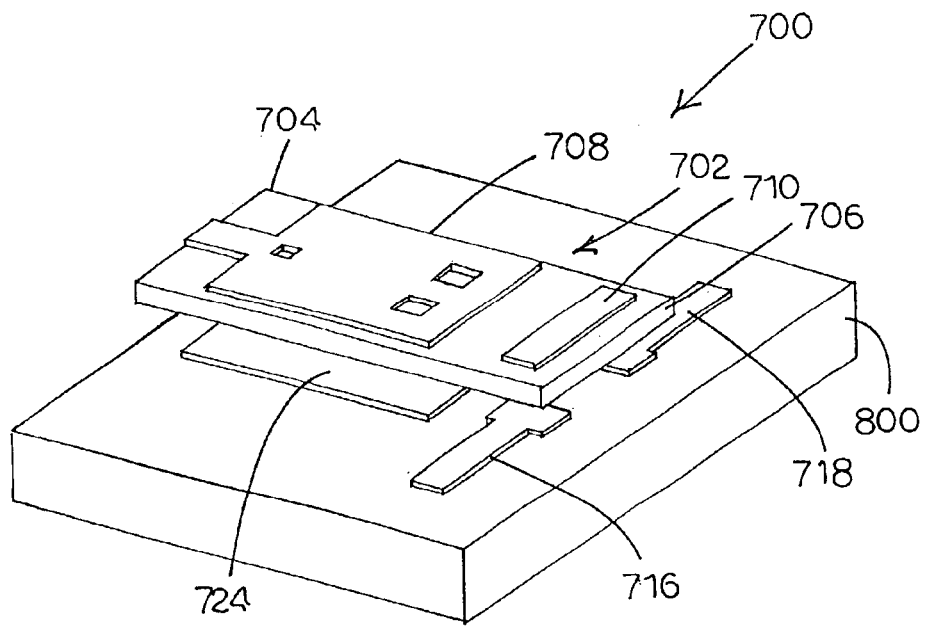
FIG. 8 illustrates a perspective top view of a MEMS switch having standoff and contact bumps operating in an "open" position.
Figure 9:
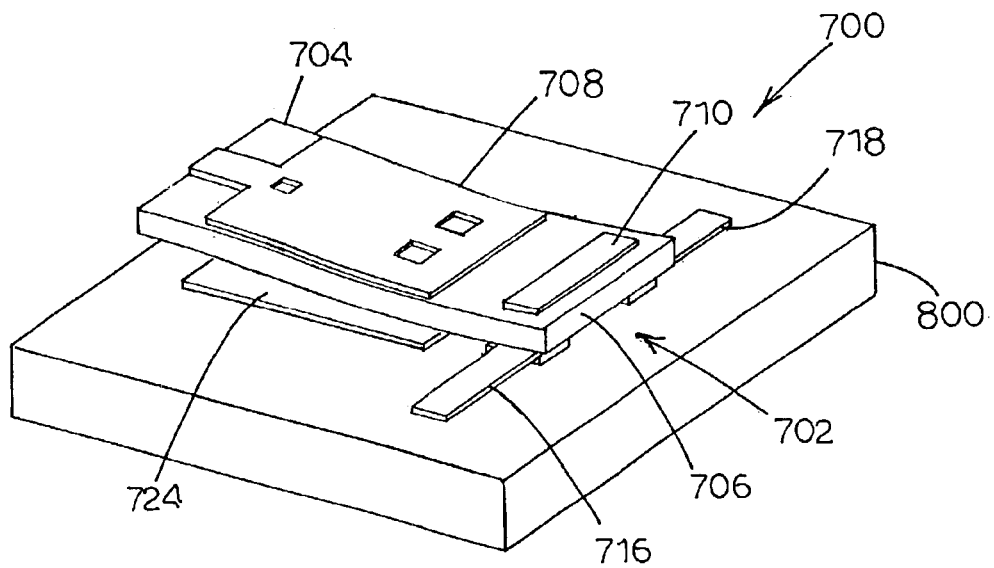
FIG. 9 illustrates a perspective top view of a MEMS switch having standoff and contact bumps operating in a "closed" position.

Referring to FIGS. 7–9, different views of another MEMS switch, generally designated 700, in accordance with another embodiment of the present invention are illustrated. Referring specifically to FIG. 7, a perspective view of the bottom side of MEMS switch 700 is illustrated. Note that for illustrative purposes the substrate (shown in FIGS. 8 and 9) is not shown in FIG. 7. MEMS switch 700 includes a beam, generally designated 702, attached at one end 704 to a mount (not shown). Beam 702 is attached to the mount via a structural layer 706. Beam 702 further includes an electrode interconnect 708 and a contact interconnect 710 attached to the top side of structural layer 706. A movable electrode 712 and a movable contact 714 are attached to the underside of structural layer 706 and positioned in alignment with and dimensioned substantially the same as electrode interconnect 708 and contact interconnect 710, respectively. Electrode interconnect 708 and contact interconnect 710 are electrically connected to movable electrode 712 and movable contact 714, respectively, through structural layer 706 by interconnect vias.

MEMS switch 700 further includes a first stationary contact 716 and a second stationary contact 718 formed on the substrate. Movable contact 714 includes a first contact bump 720 and a second contact bump 722, which protrude from movable contact 714 for reducing the gap distance between movable contact 714 and stationary contacts 716 and 718. Contact bumps 720 and 722 comprise conductive material for providing electrical connection between stationary contacts 716 and 718 when MEMS switch 700 is in the "closed" position.

MEMS switch 700 includes a stationary electrode 724 formed on the substrate. Beam 702 further includes a first standoff bump 726 and a second standoff bump 728 attached to structural layer 706 and protruding through movable electrode 712 towards stationary electrode 724. Standoff bumps 726 and 728 prevent movable electrode 712 from contacting stationary electrode 724. Standoff bumps 726 and 728 can comprise a non-conductive material for preventing an unwanted electrical short between movable electrode 712 and stationary electrode 724 and can be positioned near the end of movable electrode 712 furthest from the anchor. The positioning of standoff bumps 726 and 728 relative to contact bumps 720 and 722 can be a critical aspect. The optimal position for standoff bumps 726 and 728 is such that a maximum overdrive actuation voltage can be supported without shorting electrodes 712 and 724 and maximizing the contact force between contacts 716 and 720 and contacts 718 and 722, respectively, thereby minimizing the contact resistance. Preferably, standoff bumps 726 and 728 are positioned closer to fixed end 704 than contact bumps 720 and 722. In this configuration, contact bumps 720 and 722 establish contact with stationary contacts 716 and 718, respectively, before standoff bumps 726 and 728 establish contact with stationary electrode 724. Once contact bumps 720 and 722 contact stationary contacts 716 and 718, respectively, the actuation voltage can be increased to increase the contact force and decrease the contact resistance. The contact resistance can continue to decrease with increased actuation voltage until standoff bumps 726 and 728 contact stationary electrode 724. When contact between standoff bumps 726 and 728 and stationary electrode 724 is established, the contact resistance and chance of shorting begins to increase with increased voltage, an undesirable condition. Standoff bumps 726 and 728 can be positioned across the width of beam 702 such that as the beam width increases, the number of standoff bumps can preferably increase to preserve isolation of electrodes 712 and 724. Further, it is preferable to minimize the total surface area of structural layer 706 occupied by standoff bumps because it will reduce the amount of surface available for movable electrode 712, thus reducing electrostatic force.

Referring now to FIG. 8, a top perspective view is provided of MEMS switch 700 operating in the "open" position. Upon the application of sufficient voltage across electrode interconnect 708 and stationary electrode 724, beam 702 deflects towards a substrate 800 for operation in a "closed" position Referring now to FIG. 9, a top perspective view of MEMS switch 700 is illustrated in the "closed" position.

Figure 10:
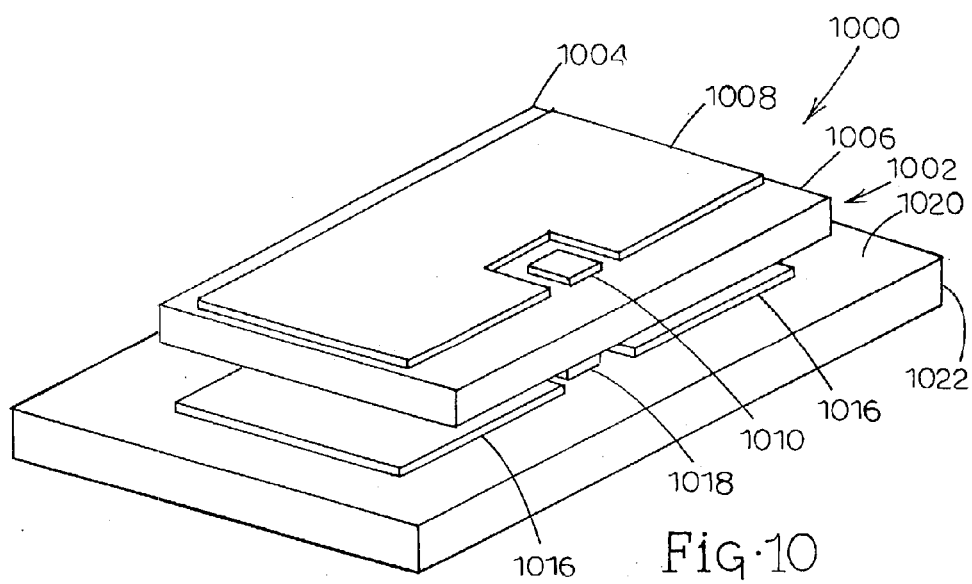
FIG. 10 illustrates a perspective view of the top side of another embodiment of a MEMS switch.
Figure 11:
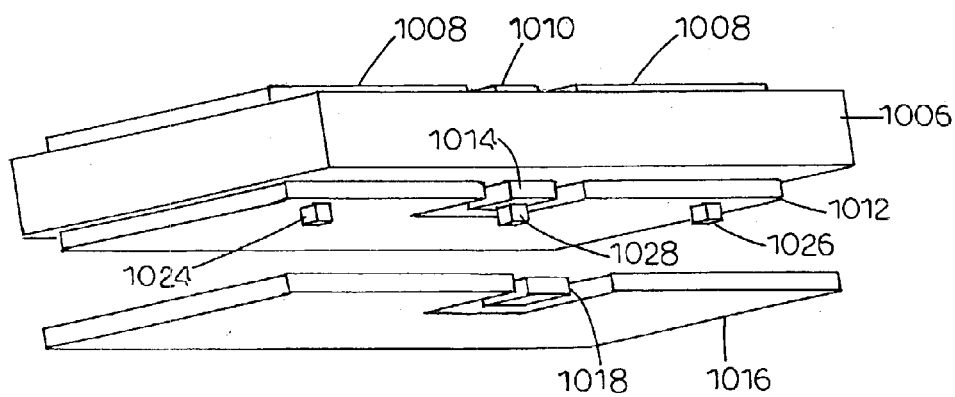
FIG. 11 illustrates a perspective side view of a MEMS switch having standoff and contact bumps.

Referring to FIGS. 10 and 11, different views of another MEMS switch, generally designated 1000, in accordance with another embodiment of the present invention are illustrated. Referring specifically to FIG. 10, a perspective view of the top side of MEMS switch 1000 is illustrated. MEMS switch 1000 includes a beam, generally designated 1002, attached at one end 1004 to a mount (not shown). Beam 1002 is attached to the mount via a structural layer 1006. Beam 1002 further includes an electrode interconnect 1008 and a contact interconnect 1010 attached to the top side of structural layer 1006. A movable electrode 1012 (shown in FIG. 10) and a movable contact 1014 (not shown) are attached to the underside of structural layer 1006 and positioned in alignment with and dimensioned substantially the same as electrode interconnect 1008 and a contact interconnect 1010, respectively. Electrode interconnect 1008 and contact interconnect 1010 are electrically connected to the movable electrode and the movable contact, respectively, through structural layer 1006 by interconnect vias as described above.

MEMS switch 1000 further includes a stationary electrode 1016 and a contact electrode 1018 formed on a surface 1020 of a substrate 1022. Stationary electrode 1016 and stationary contact 1018 are in alignment with and can be dimensioned substantially the same as electrode interconnect 1008 and a contact interconnect 1010, respectively. End 1004 of beam 1002 is fixed with respect to substrate 1022.

As shown, electrode interconnect 1008 partially surrounds contact interconnect 1010. In this embodiment, movable electrode 1012 substantially surrounds movable contact 1014. This arrangement of the electrode interconnect, movable electrode, and stationary electrode further from the anchor reduces the power necessary to move the MEMS switch to a "closed" position. Additionally, this configuration aides in preventing unwanted actuation resulting from parasitic voltages applied across stationary contact 1018 and movable contact 1014. As shown in this embodiment, electrode interconnect 1008, movable electrode 1012, and stationary electrode 1016 are wider in relation to the contact as compared with embodiments previously described herein.

Referring to FIG. 11, a side perspective view of MEMS switch 1000 is illustrated. Movable electrode 1012 includes a first and second standoff bump 1024 and 1026, respectively, preferably comprising a non-conductive material. Standoff bumps 1024 and 1026 serve to prevent shorting between movable electrode 1012 and stationary electrode 1016. As beam 1002 is deflected towards stationary electrode 1016 during operation, movable electrode 1012 is prevented from contacting stationary electrode 1016 because standoff bumps 1024 and 1026 protrude from movable electrode 1012 in the direction of stationary electrode 1016. Movable contact 1014 further includes a standoff bump 1028 comprising a conductive material.

Movable contact 1014 includes a contact bump 1028 which extends beyond standoff bumps 1024 and 1026 for contacting stationary contact 1018 before standoff bumps 1024 and 1026 during an operation to "close" MEMS switch 1000. In this embodiment, contact bump 1028 can have equal extension as the standoff bumps 1024 and 1026 for simplifying the process flow. The preferred positioning of standoff bumps 1024 and 1026 relative to contact bump 1028 is such that a maximum overdrive voltage can be supported without shorting electrodes 1012 and 1016 and wherein the contact force is maximized. Thus, standoff bumps 1024 and 1026 are positioned closer to fixed end 1004 than contact bump 1028. In this configuration, contact bump 1028 establishes contact with stationary contact 1018 before standoff bumps 1024 and 1026 establishes contact with stationary electrode 1016. Once contact bump 1028 contacts stationary contact 1018, the actuation voltage can be increased to increase the contact force and decrease the contact resistance. The contact resistance continues to decrease until standoff bumps 1024 and 1026 establish contact with stationary electrode 1016. When standoff bumps 1024 and 1026 contact stationary electrode 1016, the contact resistance and chance of shorting increases. Standoff bumps 1024 and 1026 are positioned across the width of beam 1002, such that the beam width increases, the number of standoff bumps can increase.

The preferred position of contact bump 1028 relative to standoff bumps 1024 and 1026 allows contact bump 1028 to establish contact with stationary contact 1018 before standoff bumps 1024 and 1026 contact stationary electrode 1016. This configuration provides the best contact force to be established at interface of stationary contact 1018 and contact bump 1028, which provides low contact resistance and a more reliable connection. Alternatively, a configuration can be provided wherein contact bump 1028 contacts stationary contact 1018 at the same time that stationary electrode 1016 contacts standoff bumps 1024 and 1026. Further in the alternative, a configuration can be provided wherein standoff bumps 1024 and 1026 can be structured so as to contact stationary electrode 1016 prior to the contact of stationary contact 1018 and contact bump 1028.

Figure 12:
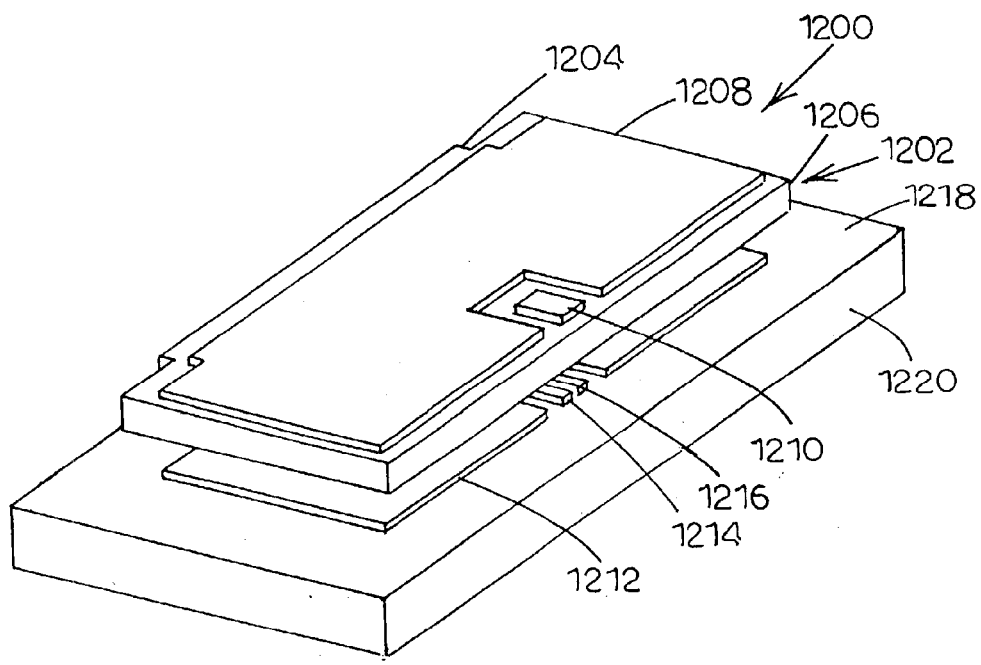
FIG. 12 illustrates a perspective top view of a MEMS switch having standoff and contact bumps in accordance with another embodiment of the present invention.
Figure 13:
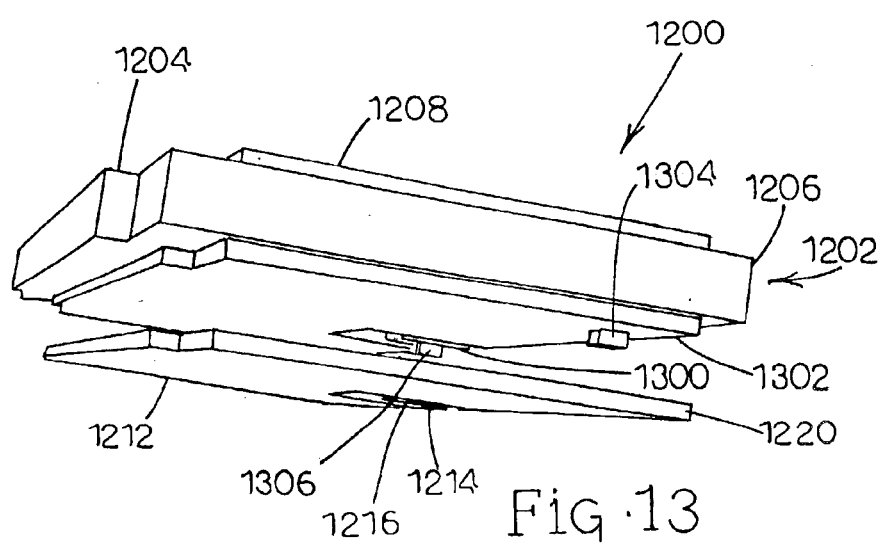
FIG. 13 illustrates a perspective bottom view of a MEMS switch having standoff and contact bumps.

Referring to FIGS. 12 and 13, different views of another MEMS switch, generally designated 1200, in accordance with another embodiment of the present invention are illustrated. Referring specifically to FIG. 12, a perspective top view of MEMS switch 1200 is illustrated. MEMS switch 1200 includes a beam, generally designated 1202, attached at an end 1204 to a mount (not shown). Beam 1202 is attached to the mount via a structural layer 1206. Beam 1202 further includes an electrode interconnect 1208 and a contact interconnect 1210 attached to the top side of structural layer 1206. A movable contact 1300 (shown in FIG. 13) and a movable electrode 1302 (shown in FIG. 13) are positioned on the under side of structural layer 1206 in alignment with and dimensioned substantially the same as electrode interconnect 1208 and a contact interconnect 1210, respectively. Electrode interconnect 1208 and contact interconnect 1210 are electrically connected to movable electrode 1302 and movable contact 1300, respectively, through structural layer 1206 by interconnect vias as described above.

MEMS switch 1200 further includes a stationary electrode 1212 and a first and second stationary contact 1214 and 1216 attached to a surface 1218 of a substrate 1220. Stationary electrode 1212 is in alignment with and dimensioned substantially the same as electrode interconnect 1208 and a contact interconnect 1210, respectively. As shown, electrode interconnect 1208 partially surrounds contact interconnect 1210. Structural layer 1206 includes a narrowed anchor zone located at end 1204 for reducing the actuating force required to "close" MEMS switch 1200. The required actuating force is reduced because the local cross-sectional area of structural layer 1206 that must be bent in the direction of stationary electrode 1212 is reduced. Contact is improved by applying an overdrive voltage to electrode interconnect 1202 and the stationary electrode.

In this embodiment, the width of structural layer 1206 is decoupled from the width of electrode interconnect 1208 or movable electrode 1302. When the width of structural layer 1206 and the width of the movable electrode are substantially the same, the actuation voltage will scale independent of the structural layer width. This means that the actuation voltage is constant for any width but the contact force and breaking force will increase. The scalability of this embodiment is limited to increasing contact/breaking force but not to reducing actuation voltage or the ability to overdrive the switch. By decoupling the width of structural layer 1206 from electrode interconnect 1208 and movable electrode (not shown), the scalability of the design increases because the actuation voltage can be minimized, the overdrive capability to achieve high contact forces can be maximized, and the contact force development can be maximized. As the width of structural layer 1206, electrode interconnect 1208, and the movable electrode increase, while the width of fixed end 1204 is held constant, the actuation voltage will decrease, the contact force will increase, the contact resistance will decrease, and the amount of overdrive will increase. The amount of overdrive capability is determined by the difference between the actuation voltage and the maximum voltage applied between the actuation electrodes. The overdrive capability (voltage difference) will increase as the difference between the actuation voltage and the maximum voltage increases.

Referring now to FIG. 13, MEMS switch 1200 further includes movable contact 1300 and movable electrode 1302. Movable electrode 1302 includes a first standoff bump 1304 and a second standoff bump (not shown) as described above. Movable contact 1300 includes a first and second contact bump 1306 and 1308 as described above. First standoff bump 1304 and the second standoff bump are configured behind contact bumps 1306 and 1308 for the reasons stated above.

Figure 14:
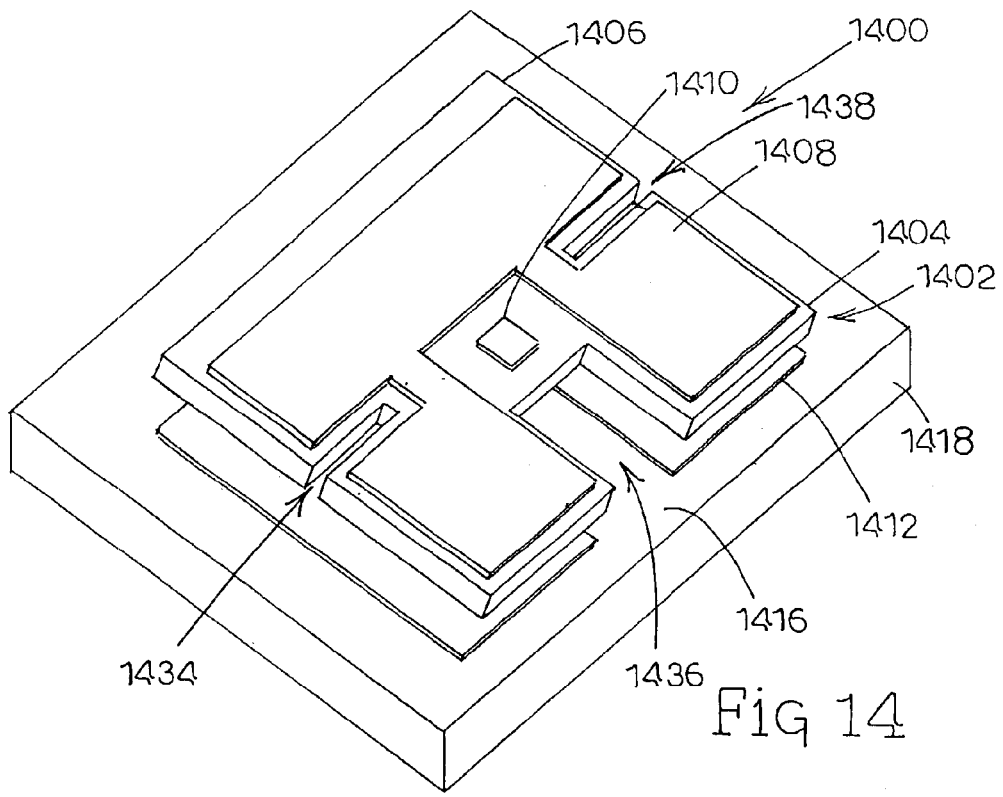
FIG. 14 illustrates a perspective top view of a MEMS switch having standoff and contact bumps in accordance with another embodiment of the present invention.
Figure 15:
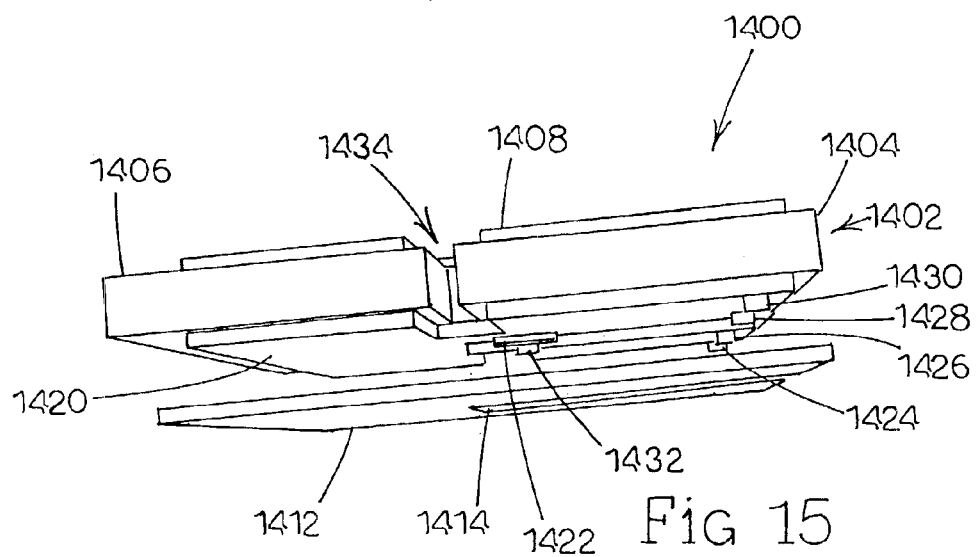
FIG. 15 illustrates a perspective side view of a MEMS switch having standoff and contact bumps.

Referring to FIGS. 14 and 15, different views of another MEMS switch, generally designated 1400, in accordance with another embodiment of the present invention are illustrated. Referring specifically to FIG. 14, a perspective top view of MEMS switch 1400 is illustrated. MEMS switch 1400 includes a beam, generally designated 1402, having a structural layer 1404 attached at one end 1406 to a mount (not shown). Beam 1402 further includes an electrode interconnect 1408 and a contact interconnect 1410 attached to the top side of structural layer 1404. A movable electrode 1420 (shown in FIG. 15) and a movable contact 1422 (shown in FIG. 15) are positioned on the underside of structural layer 1404 in alignment with and dimensioned substantially the same as electrode interconnect 1408 and a contact interconnect 1410, respectively. Electrode interconnect 1408 and contact interconnect 1410 are electrically connected to movable electrode 1420 and movable contact 1422, respectively, through structural layer 1404 by interconnect vias as described above.

Referring to FIG. 15, a perspective side view of MEMS switch 1400 is illustrated. MEMS switch 1400 further includes a stationary electrode 1412 and a stationary contact 1414 formed on a surface 1416 (shown in FIG. 14) of a substrate 1418 (shown in FIG. 14). Stationary electrode 1412 and stationary contact 1414 are in alignment with and dimensioned substantially the same as electrode interconnect 1408 and contact interconnect 1410, respectively. As shown, electrode interconnect 1408 partially surrounds contact interconnect 1410.

Beam 1402 further includes a movable electrode 1420 and a movable contact 1422. Movable electrode 1420 includes standoff bumps 1424, 1426, 1428, and 1430 positioned generally at areas of the corners of the surface of movable electrode 1420 that are located furtherest from end 1406. Standoff bumps 1424, 1426, 1428, and 1430 preferably comprise a non-conductive material. Movable contact 1422 includes a contact bump 1432 comprising a conductive material. Standoff bumps 1424, 1426, 1428, and 1430 are distal to contact bump 1432 and can establish contact with stationary electrode 1412 prior to the contact of contact bump 1432 with stationary contact 1414. Once standoff bumps 1424, 1426, 1428, and 1430 establish contact, the actuation voltage is increased to cause further deformation of beam 1402, which includes pivoting on standoff bumps 1424, 1426, 1428, and 1430. The actuation voltage is increased until contact bump 1432 establishes contact with stationary contact 1414.

Beam 1402 includes three compliance cuts, generally designated 1434, 1436, and 1438 for increasing the compliance of beam 1402. As the actuation voltage is increased to establish contact, compliance cuts 1434, 1436, and 1438 facilitate the deformation of beam 1402. Movable contact 1422 is positioned near or centered between compliance cuts 1434, 1436, and 1438 to increase the flexibility of beam 108 at the location of contact of movable contact 1422. This embodiment improves the actuation voltage to parasitic actuation ratio by extending the actuation electrodes far beyond movable contact 1422. This positioning lowers the actuation voltage and increases the parasitic actuation voltage. Furthermore, this embodiment facilitates the breading of contact because of pivoting about standoff bumps 1424, 1426, 1428, and 1430.

Figure 16:
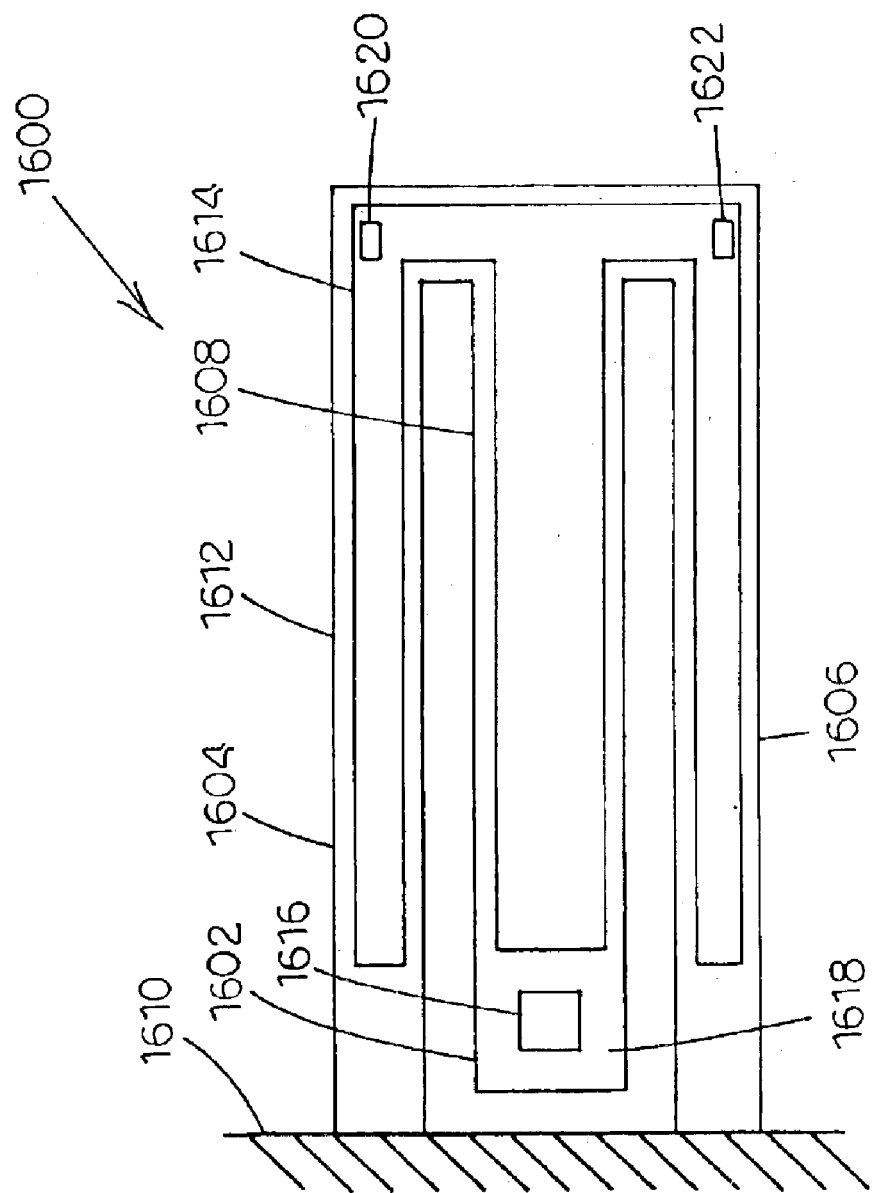
FIG. 16 illustrates a top plan view of a MEMS switch having a folded geometry and standoff and contact bumps in accordance with another embodiment of the present invention.

Referring to FIG. 16, a bottom view of a beam of a MEMS switch, generally designated 1600, having a folded beam geometry in accordance with another embodiment of the present invention is illustrated. MEMS switch 1600 includes an arm 1602 attached to two folded beams 1604 and 1606. Folded beams 1604 and 1606 are attached at an end 1608 of cantilever 1602. Folded beams 1604 and 1606 function to attach cantilever 1602 to a mount 1610 and suspend arm 1602 over a substrate (not shown). Arm 1602 and folded beams 1604 and 1606 are interconnected by a structural layer 1612 that provides a resilient structure for arm 1602 and folded beams 1604 and 1606. Arm 1602 and folded beams 1604 and 1606 include a movable electrode 1614 extending substantially over the bottom surface of structural layer 1612. Arm 1602 further includes a movable contact 1616 attached at an end 1618 distal from end 1608. An electrode interconnect (not shown) and a contact interconnect (not shown) can be positioned on the top side of structural layer 1612 in alignment with and dimensioned substantially the same as movable electrode 1614 and movable contact 1616, respectively. Movable electrode 1614 and movable contact 1616 are electrically connected to the electrode interconnect and the contact interconnect, respectively, through structural layer 1612 by interconnect vias as described above. Cantilever 1602 is suspended by folded beams 1604 and 1606 such that movable contact is positioned near mount 1610. This folding of the beam structure produces a beam having a long effective length to lower the actuation voltage. Movable contact 1616 is positioned near mount 1610 to produce a short distance to the center of electrostatic pressure of the parasitic actuation with the effect of increasing the electrostatic pressure.

The principle advantage of this embodiment is to achieve high parasitic actuation and low actuation voltage. This is accomplished by the suspension of cantilever 1602 from folded beams 1604 and 1606 and placement of movable contact 1616 near mount 1610. Upon application of the actuation voltage, folded beams 1604 and 1606 are pulled towards the substrate. As folded beams 1604 and 1606 are pulled towards the substrate, cantilever 1602 deforms either towards or away from the substrate which results in a virtual pivot point. The location of pivot point 1620 can be determined by: the relative length of cantilever 1602 to folded beams 1604 and 1606; the geometry and layout of the stationary electrode on the substrate; and the stiffness of cantilever 1602 relative to the stiffness of folded beams 1604 and 1606. For example, stationary electrode (not shown) can be limited in extent to the area directly under cantilever 1602 and the area where the distal end of cantilever 1608 connects to folded beams 1604 and 1606. The virtual pivot point is positioned to realize a low actuation voltage and a high parasitic voltage. MEMS switch 1600 includes standoff bumps 1620 and 1622 positioned at the connection of cantilever 1602 and folded beams 1604 and 1606 for preventing the short of movable electrode 1614 and the stationary electrode.

Figure 17:
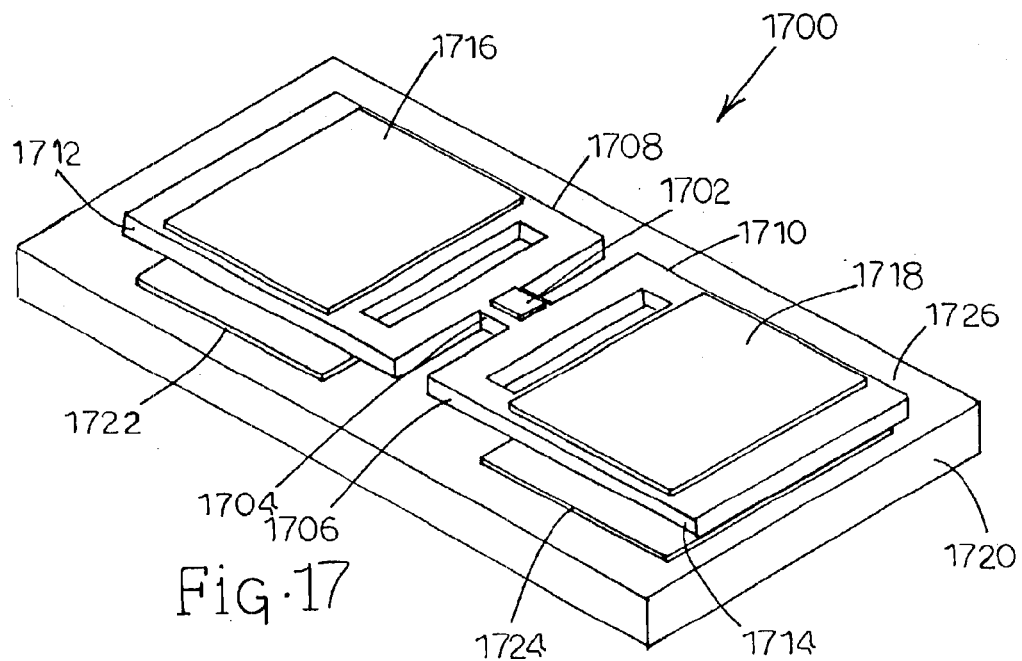
FIG. 17 illustrates a perspective top view of a MEMS switch having standoff and contact bumps in accordance with another embodiment of the present invention.
Figure 18:
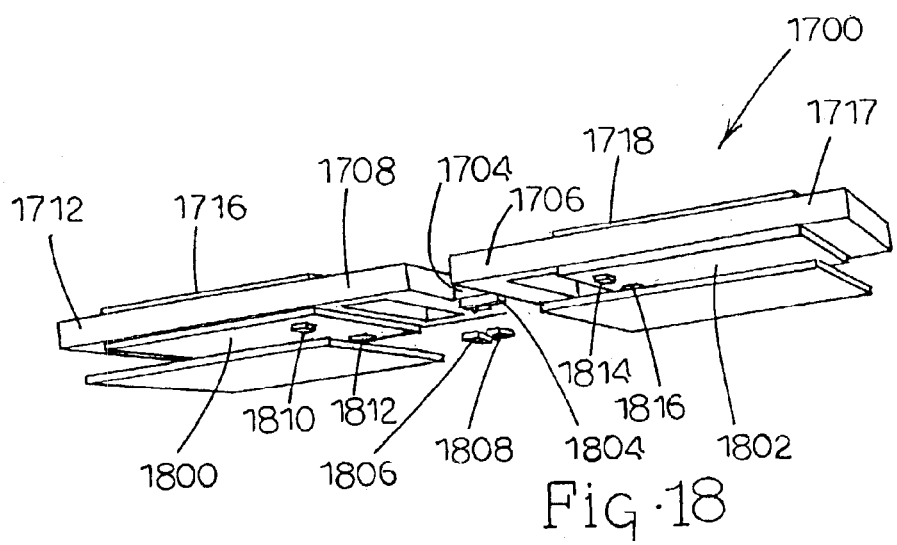
FIG. 18 illustrates a perspective view of the underside of the structural layer of a MEMS switch having standoff and contact bumps.

Referring to FIGS. 17 and 18, different views of a MEMS switch, generally designated 1700, having dual actuation electrodes in accordance with another embodiment of the present invention are illustrated. Referring specifically to FIG. 17, a perspective top view of MEMS switch 1700 is illustrated. MEMS switch 1700 includes a contact interconnect 1702 the top side of a center portion 1704 of a structural layer 1706. Center portion 1704 of structural layer 1706 is attached to a first flexure 1708 and a second flexure 1710. A first portion 1712 and a second portion 1714 of structural layer 1706 are connected to first flexure 1708 and second flexure 1710, respectively. First portion 1712 and second portion 1714 are connected to mounts (not shown).

MEMS switch 1700 further includes a first electrode interconnect 1716 and a second electrode interconnect 1718 attached to the top side of first portion 1712 and second portion 1714. A first movable electrode 1800, a second movable electrode 1802 (shown in FIG. 18), and a movable contact 1804 (shown in FIG. 18) are positioned on the underside of structural layer 1704 in alignment with and dimensioned substantially the same as first electrode interconnect 1716, second electrode interconnect 1718, and contact interconnect 1702, respectively. First electrode interconnect 1716, second electrode interconnect 1718, and contact interconnect 1702 are electrically connected to the first movable electrode, the second movable electrode, and the movable contact, respectively, through structural layer 1706 by interconnect vias as described above.

MEMS switch 1700 further includes a substrate 1720 having a first stationary electrode 1722, a second stationary electrode 1724, and a stationary contact 1806 (shown in FIG. 18) attached on a surface 1726 thereof. First stationary electrode 1722, a second stationary electrode 1724, and stationary contact 1806 can be positioned in alignment with and dimensioned substantially the same as first movable electrode 1800, second movable electrode 1802, and contact electrode 1804.

Referring now to FIG. 18, a perspective view of the underside of structural layer 1706 of MEMS switch 1700 is illustrated. As discussed above, first movable electrode 1800, second movable electrode 1802, and movable contact 1804 are attached to the underside of structural layer 1706. Substrate 1720 is not shown in FIG. 18 to illustrate positioning of first stationary electrode 1722, second stationary electrode 1724, first stationary contact 1806, and a second stationary contact 1808 with respect to first movable electrode 1800, second movable electrode 1802, a movable contact 1804, and a second movable contact 1806. Movable contact 1804 includes a contact bump 1810 preferably comprising a conductive material as described above. MEMS switch 1700 further includes standoff bumps 1812, 1814, 1816, and 1818. This embodiment has the advantage of an improved ratio of the actuation voltage to the parasitic actuation voltage. This embodiment includes two simple cantilever beam switches as described above. Movable contact 1804 and contact interconnect 1702 are suspended between two structures 1712 and 1714 by flexures 1708 and 1710. Flexures 1708 and 1710 isolate the contact from residual film stresses in the materials comprising switch 1700. During operation, actuation voltage is applied between stationary electrodes 1722 and 1724 and movable electrodes 1800 and 1802, respectively. The actuation voltage produces a deflection in cantilevered portions 1712 and 1714 of structure 1706. The actuation voltage is of such a magnitude to cause contact bump 1810 to establish contact with stationary contacts 1806 and 1808. In principle, two structures 1712 and 1714 are being driven to establish contact but the actuation voltage remains the same as actuating a single structure. The advantage is realized because the parasitic voltage must overcome the two elements, which significantly improves the actuation voltage to parasitic voltage ratio. Flexures 1708 and 1710 are compliant in the direction indicated from the end of structure 1712 to the end of structure 1714. Flexures 1708 and 1710 have limited compliance in the direction perpendicular to the substrate because this would impact the parasitic actuation negatively.

Figure 19A:
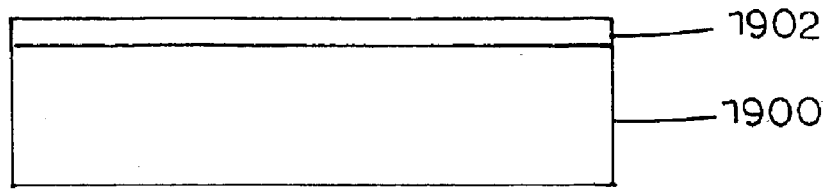
FIGS. 19A–19K illustrate fabrication steps of another embodiment of a method for fabricating a MEMS switch having standoff and contact bumps.

Referring to FIGS. 19A–19K, an embodiment of a method for fabricating a MEMS switch having standoff bumps according to a surface micromachining process of the present invention will now be described. Referring specifically to FIG. 19A, a substrate 1900 is provided and can comprise silicon. Alternatively, substrate 1900 can comprise any other suitable material known to those of skill in the art. If the composition of substrate 1900 is chosen to be a conductive or semi-conductive material, a non-conductive, first dielectric layer 1902 is deposited on the top surface of substrate 1900, or at least a portion of the top surface where electrical contacts or conductive regions are desired.

Figure 19B:
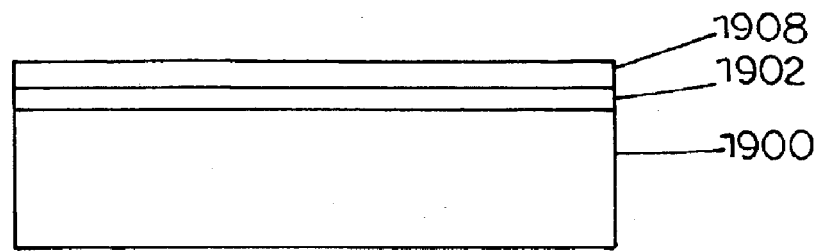
Figure 19C:
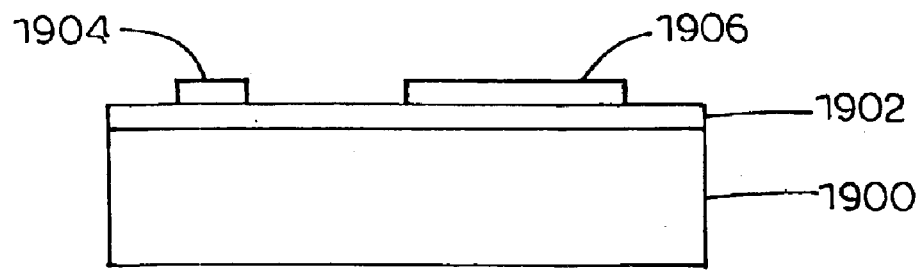

Referring to FIGS. 19B–19C, a process for producing a stationary contact 1904 and a stationary electrode 1906 is illustrated. Referring to FIG. 19B, a first conductive layer 1908 is deposited on first dielectric layer 1902. The deposition can be achieved by any suitable process known to those of skill in the art such as sputtering, evaporation, or electroplating. First conductive layer 1908 is patterned as described above. Referring to FIG. 19C, stationary contact 1904 and stationary electrode 1906 are formed simultaneously by patterning. Patterning can be achieved by any suitable process known to those of skill in the art such as lift-off, etching, or milling. The deposition of this layer can also perform the function of providing electrical interconnection with other electrical components, grounding or shielding of planes, or heat dissipation. Alternatively, stationary contact 1904 and stationary electrode 1906 can be formed in separate processes. Other layers can be provided between substrate 1900, first dielectric layer 1902, and components 1904 and 1906 for forming microcomponents for providing functionality known to those of skill in the art such as electrical communication between stationary contact 1904 and other electrical components.

Figure 19D:
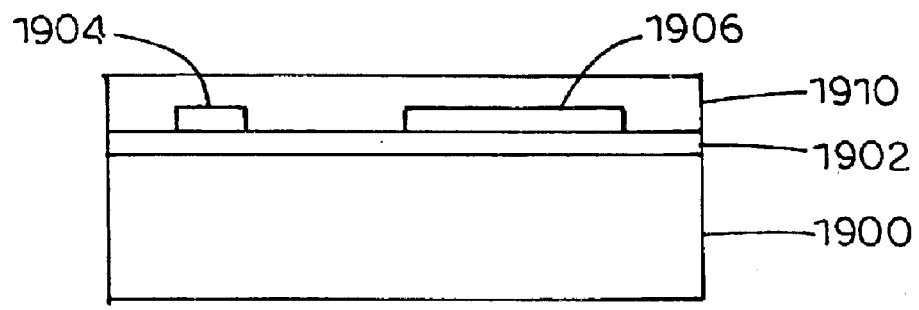

Referring to FIG. 19D, a sacrificial layer 1910 is deposited to a uniform thickness such that its top surface is preferably planarized. Sacrificial layer 1910 defines the gap between stationary contact 1904 and stationary electrode 1906 and a trilayered beam structure, described in detail below. Sacrificial layer 1910 comprises a polymer. Alternatively, sacrificial layer 1910 can be a metal, polymer, dielectric or any other suitable material known to those of skill in the art such that the removal chemistry is compatible with the other electrical and structural materials.

Alternatively, sacrificial layer 1910 can be patterned and etched such that contact bumps are recessed below structures formed on the underside of the beam structure or to form a larger structure that is recessed. Alternatively, recesses can be formed by other suitable means known to those of skill in the art.

Figure 19E:
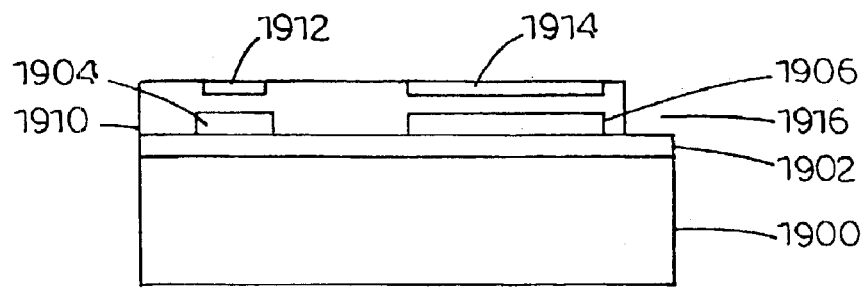

Referring to FIG. 19E, a process for producing a movable contact 1912 and a movable electrode 1914 is illustrated. Grooves can be etched in sacrificial layer 1910 for depositing movable contact 1912 and movable electrode 1914. Additionally, groove 1916 can be etched in sacrificial layer 1910 for forming a structure to attach the beam to substrate 1900 and suspend the beam above components 1904 and 1906. The groove for forming movable contact 1912 can include an additional groove portion further into sacrificial layer 310 for forming a contact bump on movable contact 1912.

Figure 19F:
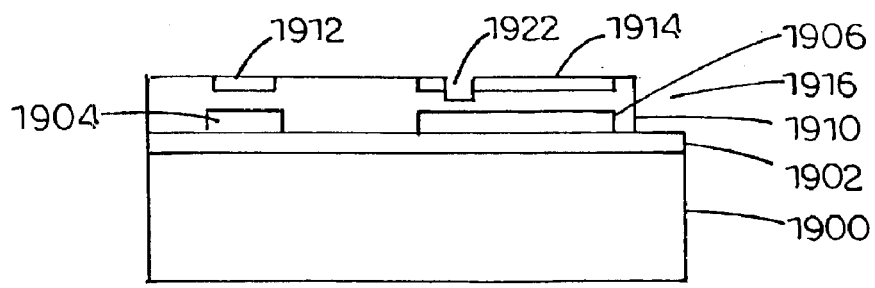
Figure 19G:
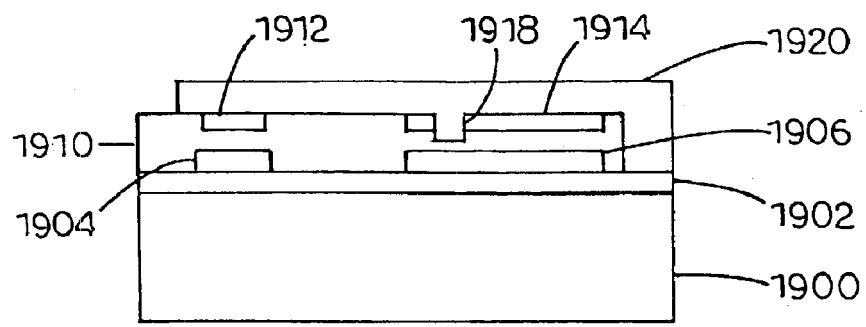

Referring to FIGS. 19F–19G, process for producing a standoff bump 1918 and a structural layer 1920 is illustrated. Referring now to FIG. 3F, a standoff via 1922 is etched through movable electrode 1914 and into sacrificial layer 1910. Alternatively, grooves can be etched for forming standoff bumps through other layers and into sacrificial layer 1910 for forming a standoff bump to extend into a gap between the beam and substrate 1900. Referring to FIG. 3G, structural layer 1920 can be deposited on movable contact 312, movable electrode 314, sacrificial layer 310, and first dielectric layer 302. Structural layer 1920 can also be deposited in standoff via 1922 for forming standoff bump 1918. Standoff bumps can be manufactured to attach to the beam for extending into the gap between the beam and the substrate in any suitable process known to those of skill in the art. Structural layer 1920 comprises oxide in this embodiment. In the alternative, standoff bump 1918 can be formed in a different step than the processing of structural layer 1920 such as by etching grooves into sacrificial layer 1910 and forming standoff bump 1918 prior to forming any subsequently formed components. This alternative can be beneficial when it is not desirable to etch through subsequently formed components for forming standoff bump 1918.

Figure 19H:
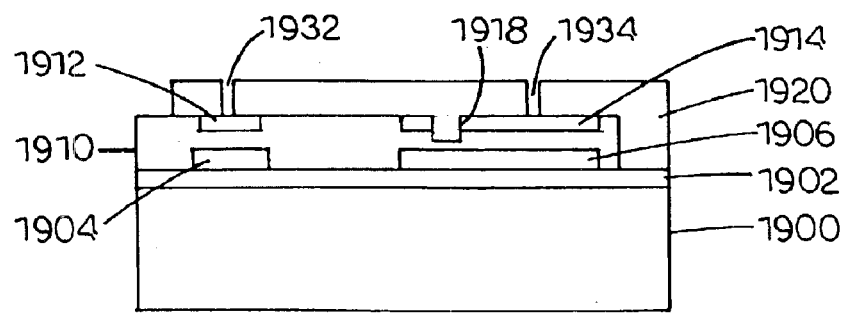
Figure 19I:
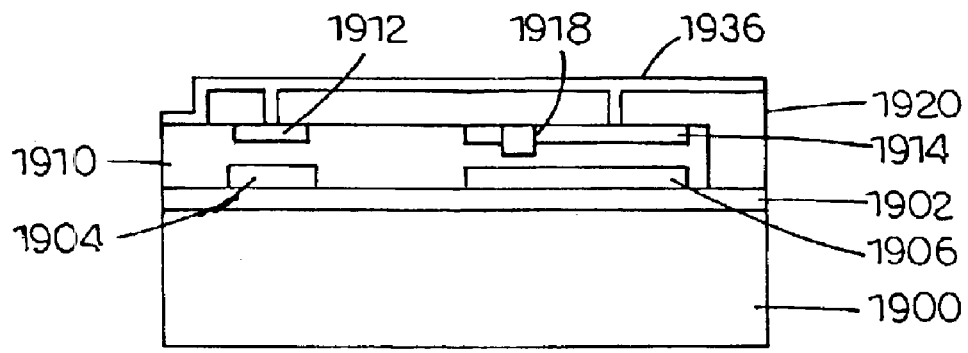
Figure 19J:
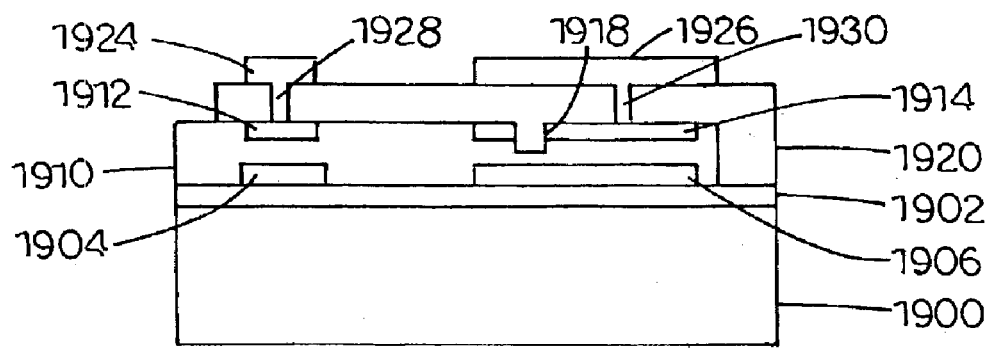

Referring to FIGS. 19H–19J, a process for simultaneously producing the following conductive microstructures: a contact interconnect 1924, an electrode interconnect 1926, and interconnect vias 1928 and 1930. Referring specifically to FIG. 19H, recesses 1932 and 1934 are etched into structural layer 1920 for forming interconnect vias 1928 and 1930, respectively. Recesses 1932 and 1934 are etched through structural layer 1920 to movable contact 1912 and movable electrode 1914.

Referring now to FIG. 19I, a second conductive layer 1936 is deposited on structural layer 1920 and into recesses 1932 and 1934 as shown for forming an electrical connection from movable contact 1912 and movable electrode 1914 to the top surface of structural layer 1920. Next, second conductive layer 1936 is patterned for forming contact interconnect 1924 and electrode interconnect 1926 as shown in FIG. 19J. Interconnect vias 1928 and 1930 can be formed by another conductive layer that would precede the deposition of second conductive layer 1936 described above.

Stationary contact 1904, stationary electrode 1906, movable contact 1912, movable electrode 1914, electrode interconnect 1926, contact interconnect 1924, and interconnect vias 1928 and 1930 comprise a metal in this embodiment. Preferably, movable electrode 1914 and electrode interconnect 1926 are fabricated of the same material and dimensioned the same in order to perform two functions. First, it provides mechanical balance on both sides of structural layer 1922. The mechanical balance is provided because of the elastic symmetry, because the films are deposited in the same way to produce a symmetric stress field, and because the thermal expansion properties are symmetric. The elastic symmetry is preserved by using the same material and by using the same dimensions. The symmetric stress field is produced by depositing the same materials using the same process and thicknesses. The symmetric thermal expansion properties minimize any variation in the switch operation with respect to temperature because the same material is on either side of structural layer 1922. This means that any functional variation exhibited by the MEMS switch depends primarily on the process variation, which can be minimized by the appropriate optimization of the design in the process. Secondly, it helps the current carrying capacity of the contact. It is preferable that the trilayered beam has the same type metal, deposited by the same process, patterned in the same geometry, and deposited to the same thickness, but the use of different materials could be accommodated with the appropriate design and characterization. To address the issues of contact adhesion, cold welding, or hot welding, stationary contact 1904, stationary electrode 1906, movable electrode 1914, movable contact 1912, electrode interconnect 1926, contact interconnect 1924, and interconnect vias 1928 and 1930 could be different materials or different alloys of the same materials. The material selection minimizes contact resistance and failures such as stiction.

Figure 19K:
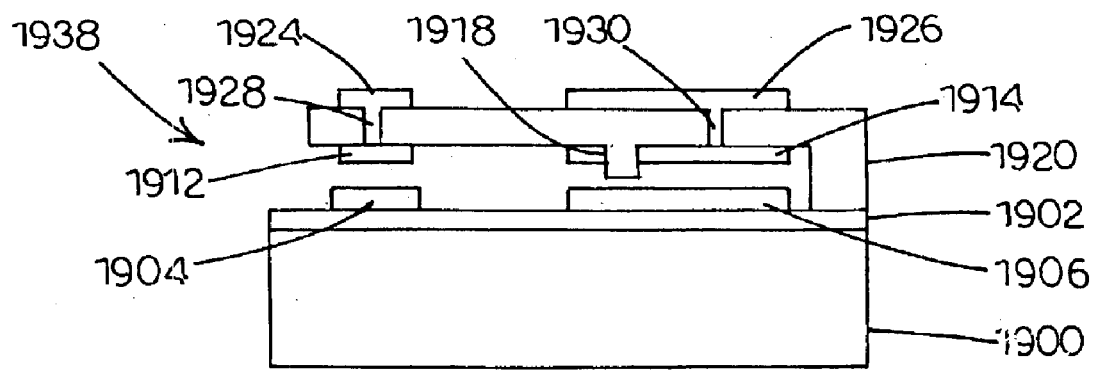

Referring to FIG. 19K, the final step in fabricating the MEMS switch is illustrated. In this step, sacrificial layer 1910 is removed to form a trilayered beam, generally designated 1938. Sacrificial layer 1910 can be removed by any suitable method known to those of skill in the art.

The MEMS switch is illustrated in an "open" position. In a "closed" position, beam 1938 is deflected towards substrate 1900 and movable contact 1912 contacts stationary contact 1904. As described above, a voltage can be applied across electrode interconnect 1926 and stationary electrode 1906 for moving the MEMS switch into a "closed" position. Standoff bump 1918 extends into the gap between stationary electrode 1906 and movable electrode 1914 to prevent electrodes 1906 and 1914 from contacting.

It will be understood that various details of the invention may be changed without departing from the scope of the invention. The switch embodiments described above can be applied to cantilever beams, doubly supported beams, plates or other known type switch geometries known to those of skill in the art. Furthermore, the foregoing description is for the purpose of illustration only, and not for the purpose of limitation—the invention being defined by the claims.

What is claimed is:

1. A movable, MEMS component suspended over a substrate, the component comprising:
   (a) a structural layer having a movable electrode separated from the substrate by a gap; and
   (b) at least one standoff bump attached to the structural layer and protruding through the movable electrode and extending into the gap for preventing contact of the movable electrode with a conductive material on the substrate when the component moves.

2. The MEMS component according to claim 1, wherein the structural layer comprises a nonconductive, resilient material.

3. The MEMS component according to claim 1, wherein the movable electrode comprises a metal material.

4. The MEMS component according to claim 1, wherein the movable electrode comprises a semiconductive material.

5. The MEMS component according to claim 1, further including an electrode interconnect attached to a side of the structural layer opposing the movable electrode and having electrical communication with the movable electrode.

6. The MEMS component according to claim 5, wherein the movable electrode and electrode interconnect have substantially equal respective coefficients of thermal expansion.

7. The MEMS component according to claim 1, wherein the at least one standoff bump comprises a nonconductive material.

8. The MEMS component according to claim 1, wherein the at least one standoff bump is attached to the movable electrode.

9. The MEMS component according to claim 1, wherein the structural layer includes at least one end fixed with respect to the substrate, and wherein the at least one standoff bump is attached to an end portion of the movable electrode distal the at least one fixed end.

10. The MEMS component according to claim 1, wherein the at least one standoff bump includes a first and second standoff bump, wherein the first standoff bump and the second standoff bump are attached to an end of the movable electrode distal the at least one fixed end.

11. The MEMS component according to claim 10, wherein the first standoff bump and the second standoff bump are positioned a substantially equal distance from the at least one fixed end.

12. The MEMS component according to claim 1, wherein the structural layer includes a movable contact for contacting a stationary contact when the movable component moves towards the stationary contact.

13. The MEMS component according to claim 12, wherein the movable contact includes at least one contact bump extending into the gap, whereby the movable contact contacts the stationary contact before the movable electrode contacts a conductive material.

14. A MEMS device having standoff bumps, the device comprising:
   (a) a substrate having a stationary electrode and a first stationary contact; and
   (b) a movable component suspended above the substrate, the component comprising:
      (i) a structural layer having a movable electrode and a movable contact, wherein the movable electrode is spaced from the stationary electrode by a first gap and the movable contact is spaced from the first stationary contact by a second gap; and
      (ii) at least one standoff bump attached to the structural layer and protruding through the movable electrode and extending into the first gap for preventing the contact of the movable electrode with the stationary electrode.

15. The MEMS device according to claim 14, wherein the structural layer comprises a nonconductive, resilient material.

16. The MEMS device according to claim 14, wherein the movable electrode comprises a metal material.

17. The MEMS device according to claim 14, wherein the movable electrode comprises a semiconductive material.

18. The MEMS device according to claim 14, wherein the component further includes an electrode interconnect attached to a side of the structural layer opposing the movable electrode and having electrical communication with the movable electrode.

19. The MEMS device according to claim 18, wherein the movable electrode and electrode interconnect have substantially equal respective coefficients of thermal expansion.

20. The MEMS device according to claim 14, wherein the at least one standoff bump comprises a nonconductive material.

21. The MEMS device according to claim 14, wherein the at least one standoff bump is positioned adjacent the movable electrode.

22. The MEMS device according to claim 14, wherein the at least one standoff bump is attached to the movable electrode.

23. The MEMS device according to claim 14, wherein the structural layer includes at least one end fixed with respect to the substrate, and wherein the at least one standoff bump is attached to an end portion of the movable electrode distal the at least one fixed end.

24. The MEMS device according to claim 14, wherein the at least one standoff bump includes a first and second standoff bump, wherein the first standoff bump and the second standoff bump are attached to an end of the movable electrode distal the at least one fixed end.

25. The MEMS device according to claim 24, wherein the first standoff bump and the second standoff bump are positioned a substantially equal distance from the at least one fixed end.

26. The MEMS device according to claim 14, wherein the movable contact is positioned at a distal end of the structural layer.

27. The MEMS device according to claim 26, wherein the movable electrode is positioned on the structural layer between the movable contact and at a fixed end of the structural layer.

28. The MEMS device according to claim 14, wherein the movable electrode includes a portion substantially surrounding the movable contact.

29. The MEMS device according to claim 28, wherein the at least one standoff bump is attached to the portion of the movable electrode substantially surrounding the movable contact.

30. The MEMS device according to claim 14, wherein the component further includes a contact interconnect attached to a side of the structural layer opposing the movable contact and having electrical communication with the movable contact.

31. The MEMS device according to claim 14, wherein the movable contact includes a contact bump extending into the second gap, whereby the movable contact contacts the first stationary contact before the movable electrode contacts the stationary electrode.

32. The MEMS device according to claim 14, wherein the movable contact includes a first and second set of contact bumps extending into the second gap, the substrate further includes a second stationary contact, whereby the first and second set of contact contacts the first stationary contact and the second stationary contact, respectively, before the movable electrode contacts the stationary electrode.

33. The MEMS device according to claim 14, wherein the component further includes at least one compliance cut extending into the structural layer.

34. The MEMS device according to claim 14, wherein the structural layer includes a first and second end fixed with respect to the substrate.

35. A MEMS switch having standoff bumps, the switch comprising:
(a) a substrate including a first and second stationary electrode and a stationary contact, wherein the stationary contact is positioned between the first and second stationary electrodes;
(b) a structural layer including a first and second end fixed with respect to the substrate and including first, second, and third portions having bottom surfaces, the bottom surfaces suspended over the substrate;
(c) a first movable electrode attached to the bottom surface of the first portion and spaced from the first stationary electrode by a first gap;
(d) a first standoff bump attached to the structural layer and extending into the first gap for preventing the contact of the first movable electrode with the first stationary electrode;
(e) a second movable electrode attached to the bottom surface of the second portion and spaced from the second stationary electrode by a second gap;
(f) a second standoff bump attached to the structural layer and extending into the second gap for preventing the contact of the second movable electrode with the second stationary electrode; and
(g) a movable contact attached to the bottom surface of the third portion and suspended over the stationary contact.

36. The switch according to claim 35, wherein the structural layer comprises a nonconductive, resilient material.

37. The switch according to claim 35, wherein the structural layer further includes:
(a) a top surface opposing the bottom surface and including first, second, and third portions opposing the first, second, and third portions, respectively, of the structural layer; and
(b) a first and second electrode interconnect attached to the first and second portions, respectively, of the top surface of the structural layer.

38. The switch according to claim 35, wherein the first and second standoff bumps comprise a nonconductive material.

39. The switch according to claim 35, wherein the first and second standoff bumps are attached to the first and second movable electrodes, respectively.

40. The switch according to claim 35, wherein the first and second standoff bumps are attached to portions of the first and second movable electrodes, respectively, positioned adjacent the movable contact.

41. A MEMS switch having standoff bumps, the switch comprising:
(a) a substrate having a stationary electrode and a stationary contact;
(b) a movable, folded component suspended above the substrate, the component comprising:
(i) a structural layer having a bottom surface and including a first and second folded beam and a cantilever attached to attachment ends of the first and second folded beams;
(ii) a movable electrode separated from the substrate by a first gap;
(iii) at least one standoff bump attached to the structural layer and extending into the first gap for preventing contact of the movable electrode with conductive material on the substrate when the component moves toward the substrate; and
(iv) a movable contact spaced from the stationary contact by a second gap.

42. The switch according to claim 41, wherein the at least one standoff bump is attached to the movable electrode.

43. The switch according to claim 41, wherein the at least one standoff bump is attached to e attachment ends of the first and second folded beams.

44. A method of implementing an actuation function in a MEMS device having standoff bumps, the method comprising:
(a) providing a MEMS device having standoff bumps, the device comprising:
(i) a substrate having a stationary electrode;
(ii) a structural layer having a movable electrode spaced from the stationary electrode by a gap; and
(iii) at least one standoff bump attached to the structural layer and protruding through the movable electrode and extending into the first gap for preventing the contact of the movable electrode with the stationary electrode when the structural layer moves towards the stationary electrode; and
(b) applying a voltage between the movable electrode and the stationary electrode to electrostatically couple the movable electrode with the stationary electrode across the gap, whereby the structural layer is moved toward the substrate and the at least one standoff bump contacts the stationary electrode.

45. A method for fabricating a movable, MEMS component having a standoff bump, comprising:
(a) depositing a sacrificial layer on a conductive component;
(b) forming a movable electrode on the sacrificial layer for spacing the movable electrode and the conductive component by a gap upon the removal of the sacrificial layer;

(c) forming a standoff bump in the sacrificial layer whereby the standoff bump extends into the gap between the movable electrode and the conductive component;

(d) depositing a structural layer on the movable electrode and the standoff bump; and (e) removing the sacrificial layer to form a gap spacing the conductive component from the movable electrode whereby the standoff bump extends into the gap for preventing contact of the movable electrode with the conductive component when the moveable electrode moves.

46. The method according to claim 45, wherein the movable electrode is composed of conductive material.

47. The method according to claim 45, wherein the movable electrode is composed of semiconductive material.

48. The method according to claim 45, wherein the standoff bump is composed of a nonconductive material.

49. A method for fabricating a MEMS device having a standoff bump, the method comprising:

(a) forming a stationary electrode on a substrate;

(b) depositing a sacrificial layer on the stationary electrode and the substrate;

(c) forming a movable electrode on the sacrificial layer for spacing the movable electrode and the stationary electrode by a gap upon the removal of the sacrificial layer;

(d) forming a standoff bump in the sacrificial layer whereby the standoff bump extends into the gap between the movable electrode and the stationary electrode formed by the removal of the a sacrificial layer;

(e) depositing a structural layer on the movable electrode and the standoff bump; and (f) removing the sacrificial layer to form a gap spacing the stationary electrode and the movable electrode whereby the standoff bump extends into the gap for preventing contact of the movable electrode with a conductive material on the substrate when the structural layer moves towards the stationary electrode.

50. The method according to claim 49, wherein the movable electrode is composed of conductive material.

51. The method according to claim 49, wherein the movable electrode is composed of semiconductive material.

52. The method according to claim 49, wherein the standoff bump is composed of a nonconductive material.

53. The method according to claim 49, further including forming a stationary contact on the substrate.

54. The method according to claim 49, further including forming a movable contact on the sacrificial layer.

55. The method according to claim 49, wherein forming a standoff bump further includes forming the standoff bump adjacent the movable electrode.

* * * * *